(12) United States Patent
Ballantyne

(10) Patent No.: US 6,909,331 B2
(45) Date of Patent: Jun. 21, 2005

(54) PHASE LOCKED LOOP HAVING A FORWARD GAIN ADAPTATION MODULE

(75) Inventor: Gary J. Ballantyne, Christchurch (NZ)

(73) Assignee: Qualcomm Incorporated, San Diego, CA (US)

( * ) Notice: Subject to any disclaimer, the term of this patent is extended or adjusted under 35 U.S.C. 154(b) by 25 days.

(21) Appl. No.: 10/442,340

(22) Filed: May 20, 2003

(65) Prior Publication Data

US 2004/0041636 A1 Mar. 4, 2004

Related U.S. Application Data

(60) Provisional application No. 60/406,435, filed on Aug. 28, 2002.

(51) Int. Cl.[7] ............................................... H03L 7/00
(52) U.S. Cl. ............................ 331/10; 331/15; 331/16
(58) Field of Search ............................. 331/10, 15–17, 331/1 A, 25; 455/260, 264

(56) References Cited

U.S. PATENT DOCUMENTS

| 5,207,491 A | 5/1993 | Rottinghaus ................ 331/16 |
| 5,483,203 A | 1/1996 | Rottinghaus ................ 331/10 |
| 6,008,703 A * | 12/1999 | Perrott et al. ............. 332/100 |
| 6,552,618 B2 * | 4/2003 | Nelson et al. ............... 331/11 |
| 6,625,197 B1 * | 9/2003 | Lundby et al. ............. 375/130 |

FOREIGN PATENT DOCUMENTS

| EP | 0961412 A1 | 12/1999 | ........... H03L/7/197 |
| WO | 9943080 A1 | 8/1999 | ........... H03C/3/08 |

* cited by examiner

Primary Examiner—Benny Lee
Assistant Examiner—Joseph Chang
(74) Attorney, Agent, or Firm—Philip Wadsworth; Charles D. Brown; Howard H. Seo

(57) ABSTRACT

A communications system using a phase locked loop employing two-point modulation is disclosed. The phase locked loop further includes a master oscillator having an output operably coupled to a first input of the phase detector; a slave oscillator having an output operably coupled to a second input of the phase detector, and a forward-gain-adaptation module having a first input operably coupled to the raw-error terminal of the phase detector.

40 Claims, 18 Drawing Sheets

TWO POINT MODULATION

LINEAR MODEL OF ΣΔ FRACTIONAL-N PLL

EQUIVALENT LINEAR MODEL OF ΣΔ FRACTIONAL-N PLL

ΣΔ FRACTIONAL-N PLL WITH ADAPTATION USING RAW ERROR.

ΣΔ FRACTIONAL-N PLL WITH ADAPTATION USING RAW ERROR.

ΣΔ FRACTIONAL-N PLL WITH ADAPTATION USING FILTERED ERROR.

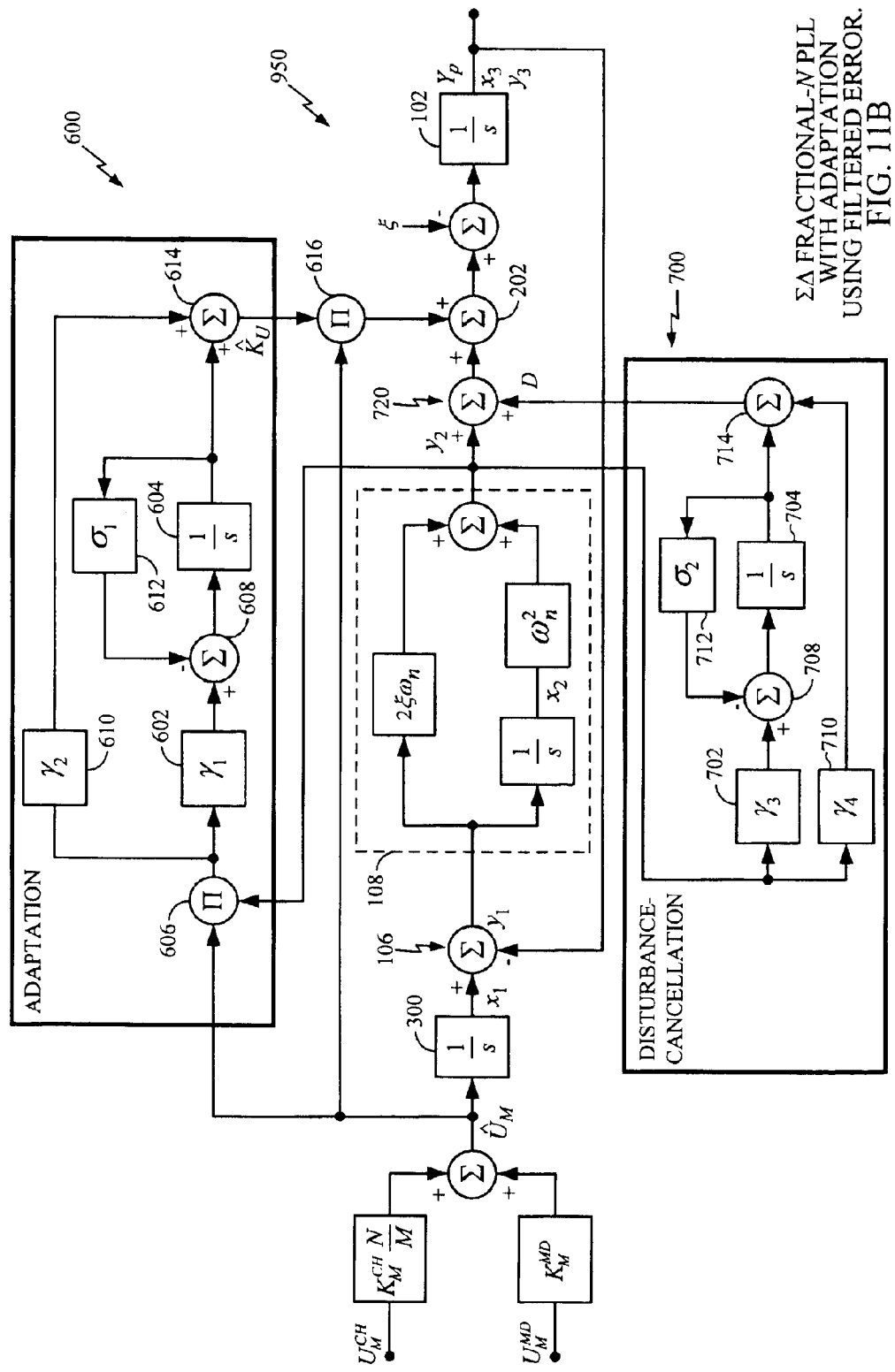
FIG. 11B ΣΔ FRACTIONAL-N PLL WITH ADAPTATION USING FILTERED ERROR.

PHASE LOCKED LOOP HAVING A FORWARD GAIN ADAPTATION MODULE

This application claims the benefit under 35 U.S.C. § 119(e) of U.S. Provisional Patent Application No. 60/406,435 filed Aug. 28, 2002, entitled "Phase Locked Loop Method and Apparatus," naming Gary Ballantyne as inventor, such provisional application hereby incorporated by reference herein in its entirety.

BACKGROUND

1. Technical Field

The present application relates, in general, to phase locked loops.

2. Description of the Related Art

Phase locked loops are electrical circuits which provide relatively stable output waveforms of varying frequencies by use of a master oscillating circuit that has a relatively fixed frequency.

FIG. 1 shows a block diagram representation of a phase locked loop 150. The master oscillator 100 has a voltage input labeled $U_M$. The master oscillator 100 produces highly stable oscillation about some defined center frequency of the oscillator. The frequency of oscillation can be varied slightly by varying the value of voltage input $U_M$. The master oscillator 100 has a sensitivity rating of $K_M$ Hertz per volt (Hz/Volt) which indicates the proportionality between the input voltage and the frequency of oscillation of the output voltage of the master oscillator 100.

A slave VCO 102 produces an oscillatory output signal whose frequency is dependent upon the value of a voltage input $V_{VCO}$ of the slave VCO 102. The slave VCO 102 generally has a sensitivity rating of $K_V$ Hertz per volt (Hz/Volt) which indicates the proportionality between the input voltage and the frequency of oscillation of the output voltage of the slave VCO 102.

The master oscillator 100 typically oscillates in a highly stable manner, but is relatively limited with respect to the frequencies at which it may oscillate. In contrast, the slave VCO 102 is typically highly flexible with respect to the frequencies at which it may oscillate, but oscillates in a highly unstable manner. The phase locked loop 150 is a circuit which attempts to take advantage of the best properties of the master oscillator 100 and the slave VCO 102, while avoiding the limitations of both.

The output of the phase locked loop 150, which is also the output of the slave VCO 102, is fed to a "divide by N" (1/N) frequency divider 104. The "divide by N" frequency divider 104 accepts as input a voltage waveform having a frequency of $f_1$ and transmits as output a "divided by N" frequency version of the $f_1$ frequency waveform. The output of the 1/N frequency divider 104 is fed into one input of a differential frequency/phase voltage controller 106. The output of master oscillator 100 is fed into another input of the differential frequency/phase voltage controller 106.

Differential frequency/phase voltage controller 106 is shown as a summing junction in negative feedback configuration. This configuration indicates that the differential frequency/phase voltage controller 106 will produce substantially constant output (e.g., zero) if its two inputs are the same, but will produce some change in its output if its two inputs are different. For example, in the situation where the differential frequency/phase voltage controller 106 detects that the voltage waveform emerging from the 1/N frequency divider 104 is "lagging" the voltage waveform emerging from the master oscillator 100, the differential frequency/phase voltage controller 106 would slightly increase its output voltage to cause a corresponding increase of the output frequency of the waveform produced by the slave VCO 102. Conversely, in the situation where the differential frequency/phase voltage controller 106 detects that the voltage waveform emerging from the 1/N frequency divider 104 is "leading" the voltage waveform emerging from master oscillator 100, in one implementation the differential frequency/phase voltage controller 106 would slightly decrease its output voltage to cause a correspondent decrease of the output frequency of the waveform produced by the slave VCO 102.

Note that even though the differential frequency/phase voltage controller 106 is actually detecting a frequency differential, if the depicted frequency differential is viewed as being "relative to" the 100 kHz reference frequency produced by the master oscillator 100, from the standpoint of the differential frequency/phase voltage controller 106 it appears "as if" the output voltage of the 1/10 frequency divider 104 is "out of phase" (e.g., either "lagging" or "leading" in time) with the 100 kHz reference frequency waveform. Consequently, those having ordinary skill in the art often refer to the differential frequency/phase detector portion (e.g., see FIG. 3) of the differential frequency/phase voltage controller 106 solely as a "phase detector."

The one block which has not yet been discussed is a loop filter 108 block. As noted, the differential frequency/phase voltage controller 106 determines the difference in frequency/phase between its inputs, and outputs a voltage signal corresponding to the difference in more-or-less real time. As also noted, this output signal of the differential frequency/phase voltage controller 106 is ultimately used to drive the slave VCO 102. If the slave VCO 102 is allowed to respond to every real time voltage fluctuation of the differential frequency/phase voltage controller 106, the slave VCO 102 will often "overreact" and produce a relatively unstable output voltage waveform. Better stability is achieved by making the slave VCO 102 "less sensitive" to the more quickly varying changes of the voltage output of the differential frequency/phase voltage controller 106. This is achieved by placing the loop filter 108 between the differential frequency/phase voltage controller 106 and the voltage input $V_{VCO}$ of the slave VCO 102, where a loop filter 108 screens, or "filters out," any rapid changes in the output voltage of the differential frequency/phase voltage controller 106 which tend to make the output of the slave VCO 102 (and hence the output of the phase locked loop 150) behave erratically.

The inventor has recognized needs related to stability of related art phase locked loops, and has devised methods and systems to satisfy those needs. Because the inventor's recognition of such needs constitutes a part of the inventive content herein, such recognized needs are discussed in the following detailed description.

BRIEF SUMMARY

In one embodiment, a communications system is characterized by: a master oscillator having an output operably coupled to a first input of a phase detector; a slave oscillator having an output operably coupled to a second input of the phase detector; and a forward-gain-adaptation module having a first input operably coupled to a raw-error terminal of the phase detector.

In another embodiment, a method for controlling a communications system includes: adjusting a feed-forward gain of a phase locked loop in response to a raw-error signal of the phase locked loop; and adjusting a slave oscillator of the phase locked loop in response to the feed-forward gain.

In another embodiment, a communications system includes: a master oscillator having an output operably coupled to a first input of a phase detector; a slave oscillator having an output operably coupled to a second input of the phase detector; and a forward-gain-adaptation module having a first input operably coupled to a filtered-error terminal of the phase detector.

In another embodiment, a method for controlling a communications system includes: adjusting a feed-forward gain of a phase locked loop in response to a filtered-error signal of a phase locked loop; creating a disturbance-cancelled filtered-error signal; and adjusting a slave oscillator of the phase locked loop in response to the feed-forward gain and the disturbance-cancelled filtered-error signal.

The foregoing is a summary and thus contains, by necessity, simplifications, generalizations and omissions of detail; consequently, those skilled in the art will appreciate that the summary is illustrative only and is NOT intended to be in any way limiting. Other aspects, inventive features, and advantages of the devices and/or processes described herein, as defined solely by the claims, will become apparent in the non-limiting detailed description set forth herein.

BRIEF DESCRIPTION OF THE SEVERAL VIEWS OF THE DRAWINGS

FIG. 11B illustrates a representation of a system somewhat similar to the system depicted in FIG. 11A, but with additional components.

The use of the same symbols in different drawings typically indicates similar or identical items.

DETAILED DESCRIPTION

I. Unadapted System

Figure 1:
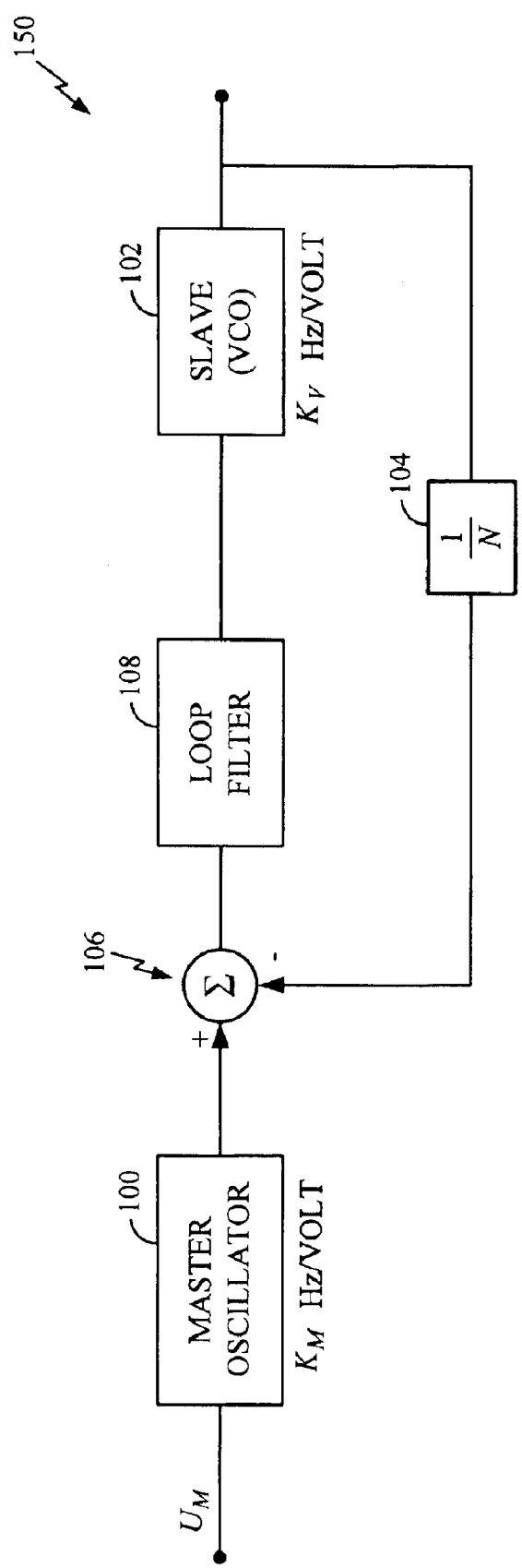
FIG. 1 shows a block diagram representation of a phase locked loop.
Figure 2:
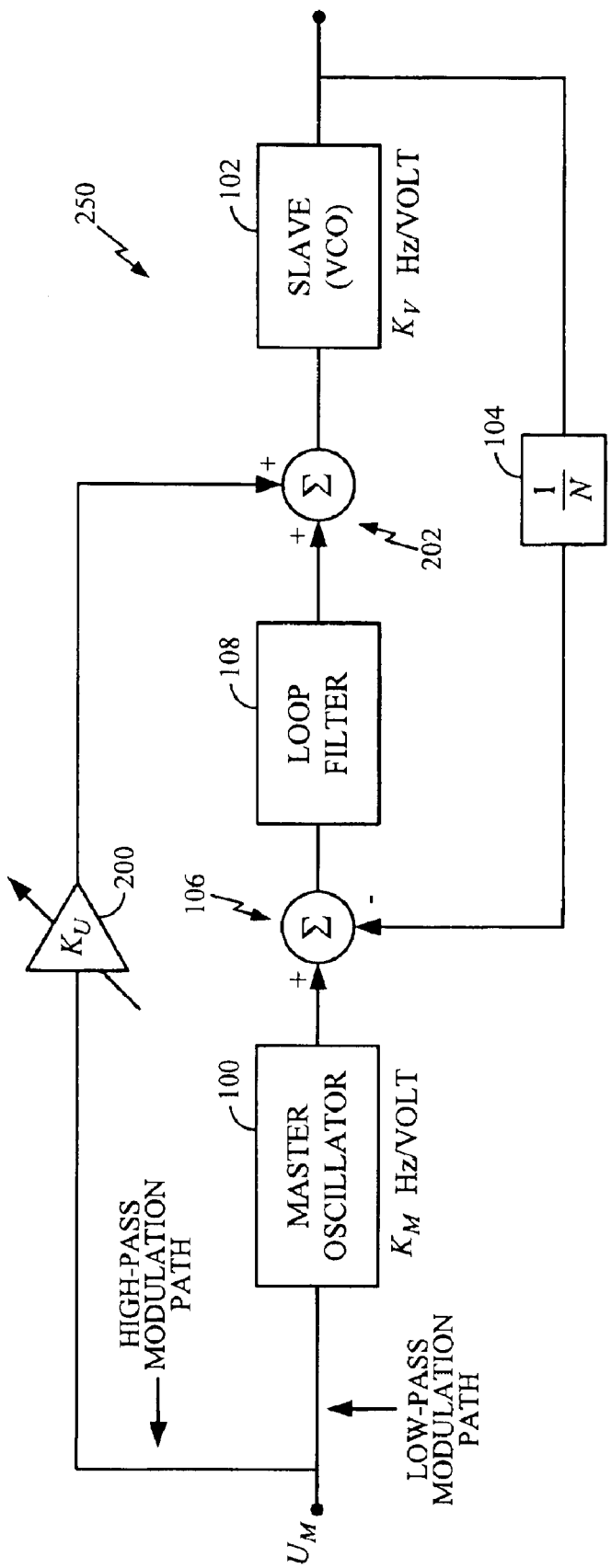
FIG. 2 shows a high-level block diagram of a phase locked loop wherein two-point modulation is utilized.

FIG. 2 shows a high-level block diagram of a phase locked loop 250 employing two-point modulation. A voltage input $U_m$ of a master oscillator 100 feeds a variable gain amplifier 200, where the variable gain amplifier 200 has a feed-forward gain $K_u$. An output of the variable gain amplifier 200 feeds a summation junction 202, which is shown interposed between a loop filter 108 and a slave VCO 102. The remaining components of the phase locked loop 250 function in a similar fashion as described in relation to FIG. 1.

The variable gain amplifier 200 enhances the overall operational bandwidth (i.e., a band of frequencies within which the phase locked loop 250 is viable) of the phase locked loop 250 beyond that associated with the phase locked loop 150 of FIG. 1, if the feed-forward gain $K_u$ is set to a correct value. Several different techniques exist for determining the substantially optimal value for the feed-forward gain $K_u$. For example, measurement devices (such as an oscilloscope, or a spectral density meter) may be used to monitor signals, and the feed-forward gain $K_u$ manually adjusted (e.g., via use of a screwdriver), to substantially maximize the overall operational bandwidth of the phase locked loop 250. However, technicians generally implement these techniques in an ad-lock fashion, rather than in conformance with any defined engineering rules.

The inventor of the subject matter disclosed herein (the inventor) has devised processes and related devices to substantially maximize the overall operational bandwidth of a phase locked loop according to defined rules. These devices and processes will now be described.

Figure 3:
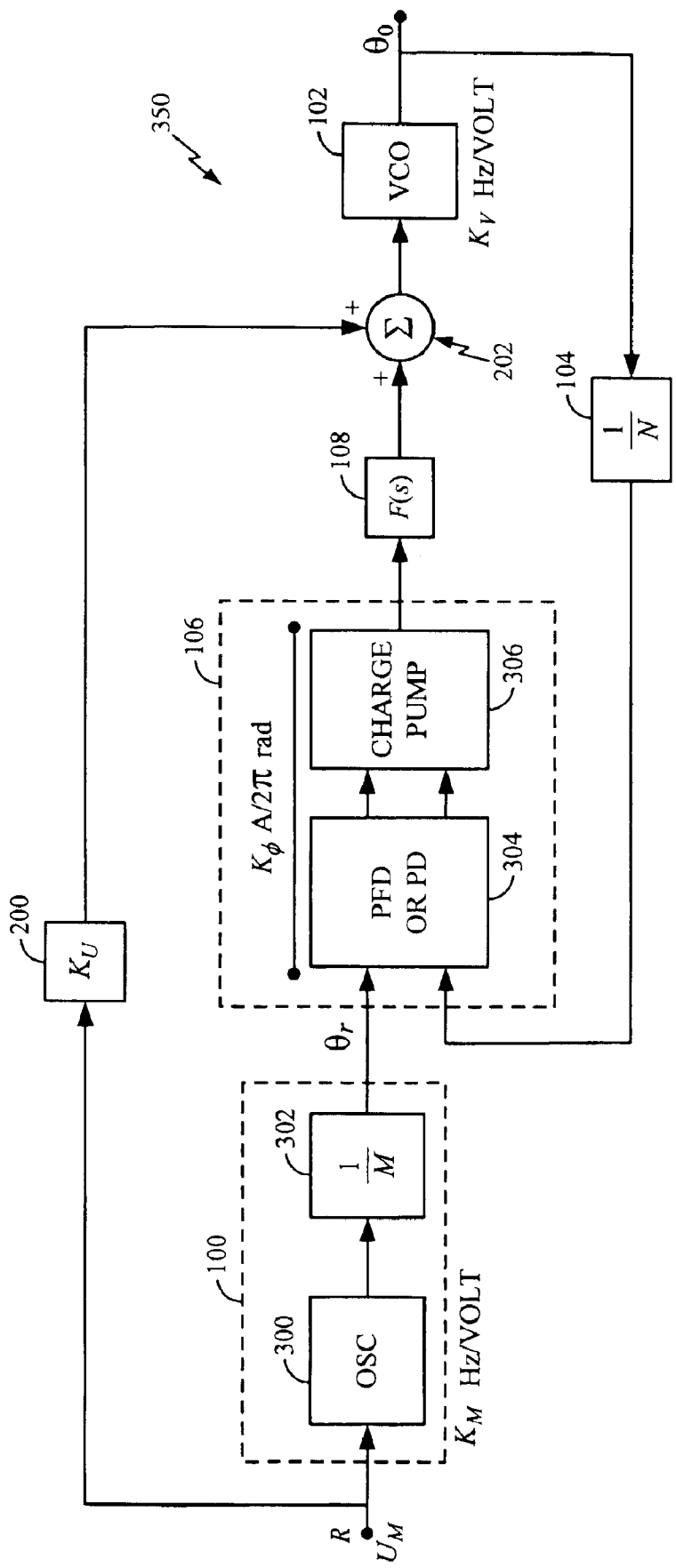
FIG. 3 shows a block diagram of a phase locked loop which is represented in Laplace transformed format.

FIG. 3 shows a block diagram of a phase locked loop 350 which is represented in a Laplace transformed format. In circuit analysis, the Laplace transform is used to transform a set of integrodifferential equations from the time domain to a set of algebraic equations in the frequency domain. The solution for an unknown quantity is therefore reduced to the manipulation of algebraic equations. Once the frequency domain expression for the unknown is obtained, it can be inverse-transformed back to the time domain using known techniques. The Laplace transformed format block diagram circuits and devices described herein are representative of their time domain representations, and vice versa.

With respect to FIG. 3, in one implementation a master oscillator 300 in conjunction with a 1/M frequency divider 302 forms the master oscillator 100. In general, the 1/M frequency divider 302 adds stability to the master oscillator 100. The master oscillator 300 feeds an input of the "divide by M" (1/M) frequency divider 302. An output of the 1/M frequency divider 302 is coupled to an input of the differential phase/frequency voltage controller 106.

In one implementation, the differential phase/frequency voltage controller 106 is composed of a differential phase/frequency detector 304 which feeds a charge pump 306. The output of the charge pump 306 is coupled to an input of the loop filter 108 (shown as being represented in the Laplace transformed s-domain). An output of the loop filter 108 is coupled to an input of the summing junction 202.

An output of the variable gain amplifier 200 is coupled to an input of the summing junction 202, while an input of the variable gain amplifier 200 is coupled to the input $U_M$ of the master oscillator 300. An output of the summing junction 202 is coupled to an input of a slave VCO 102. An output of the slave VCO 102 is coupled to an input of a "divide by N" (1/N) frequency divider 104. An output of the "divide by N" (1/N) frequency divider 104 is coupled to an input of the differential phase/frequency detector 304.

Figure 4:
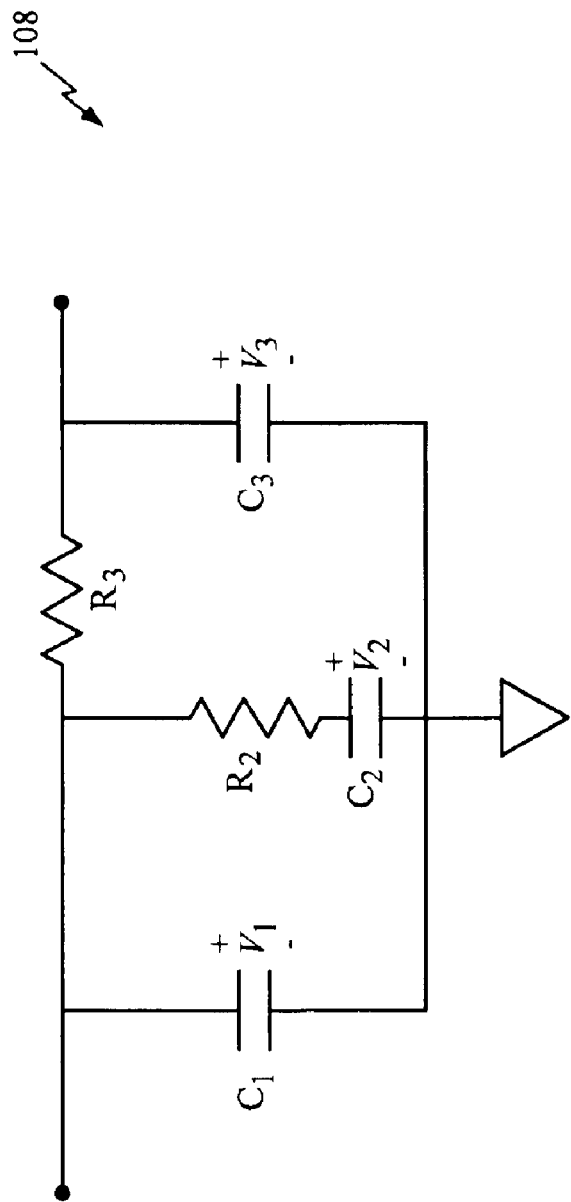
FIG. 4 shows a schematic diagram of one implementation of the loop filter.

FIG. 4 shows a schematic diagram of one implementation of the loop filter 108. Those having ordinary skill in the art will appreciate that with respect to the electrical circuit components shown, resistance $R_2$ and capacitance $C_2$ control the loop dynamics. Consequently, the following discussion herein mainly takes into account only the effects of resistance $R_2$ and capacitance $C_2$. However, the remaining components shown in FIG. 4 can be taken into consideration, especially if numerical simulation of the processes and devices shown and described herein is performed.

Figure 5A:
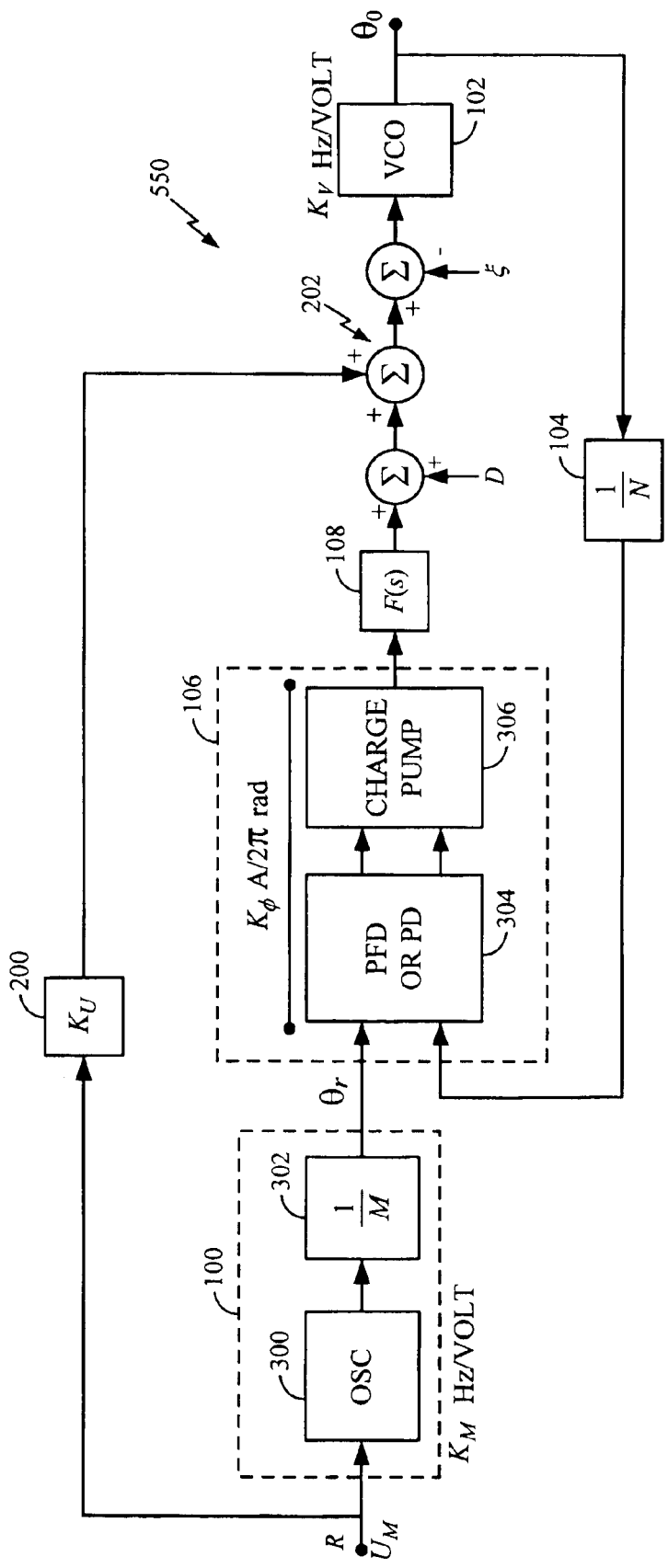
FIG. 5A depicts an alternative system version of the system depicted in FIGS. 2–4, where the alternative version is substantially the system of FIG. 3 augmented by two extra signals: a first signal, $\xi$, to indicate some uncontrollable and unexpected external influence to the system (e.g., noise), and an internal canceling signal, D, which is intended to cancel the residual influence of $\xi$ which is not counteracted by the loop filter.

FIG. 5A depicts an alternative system 550. Alternative system 550 is substantially similar to the system of FIG. 3, augmented by two extra signals: a first signal, $\xi$, to indicate some uncontrollable and unexpected external influence to the system (e.g., noise), and an internal canceling signal, D, which is intended to cancel the residual influence of $\xi$ which is not counteracted by the loop filter 108. Internal canceling signal, D, is explained in more detail in relation to FIGS. 7A and 7B, below.

Figure 5B:
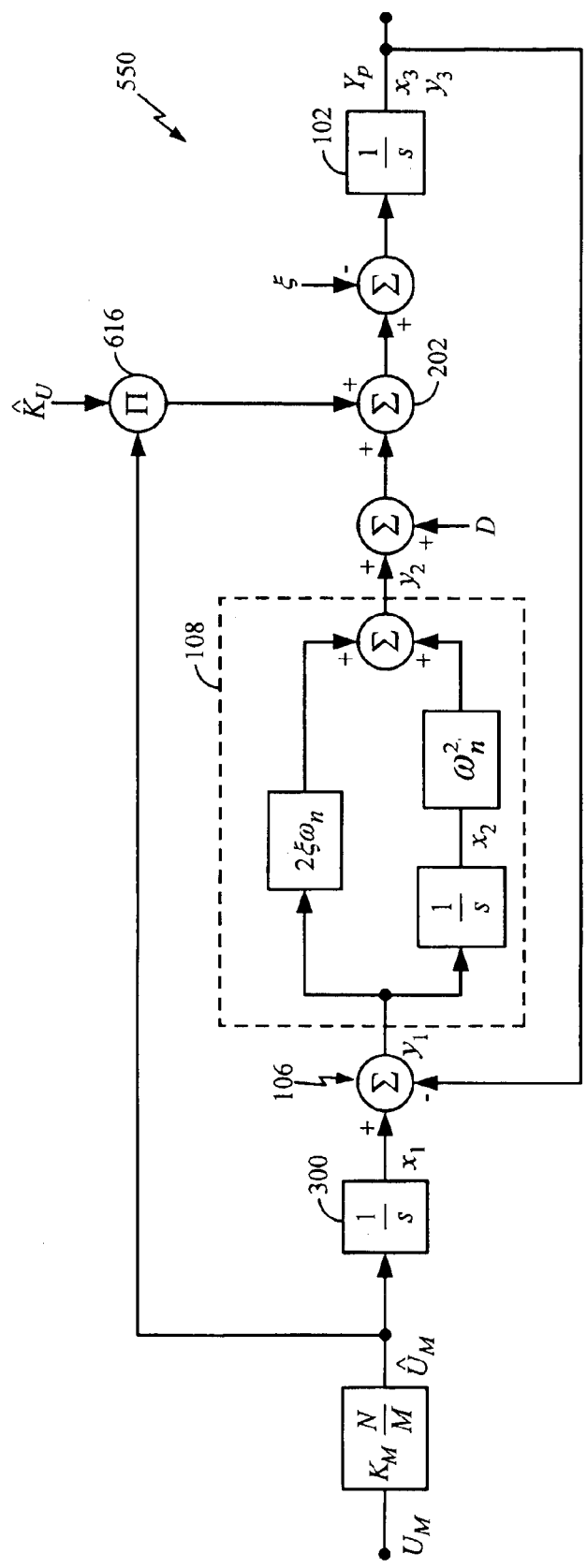
FIG. 5B shows the system of FIG. 5A represented in what those skilled in the art will recognize as somewhat analogous to a Laplace-transformed second order system "standard equation," or "canonical" form.

FIG. 5B shows the system of FIG. 5A represented in what those skilled in the art will recognize as somewhat analogous to a Laplace-transformed second order system "standard equation," or "canonical" form. The standard equation, or canonical, representation of FIG. 5B is equivalent to that of FIG. 5A, but is easier to manipulate and compare than a system not which is not written in canonical form, because many system manipulation techniques use nomenclature similar to that of FIG. 5B. The representation of FIG. 5B is the result of mathematical substitutions and algebraic manipulations whose details need not be discussed here. In addition, as will be shown below, representing the system as shown in FIG. 5B allows certain state equations to be written by inspection, which in one implementation proves advantageous. Even though the following quantities are described in canonical form, they are substantially equivalent to their non-canonical forms, and such non-canonical equivalents can be determined via standard transformation methods. The canonical forms are utilized as a courtesy herein for ease of understanding and manipulation.

The representation of FIG. 5B can be equated to that of FIG. 5A via the following relationships:

$$\hat{K}_U = \frac{K_U K_V M}{K_M N}, \quad (1)$$

$$\omega_n^2 = \frac{K_\phi K_V}{C_2 N}, \quad (2)$$

$$2\zeta\omega_n = \frac{R_2 K_V K_\phi}{N}. \quad (3)$$

Those having ordinary skill in the art will appreciate that with D=$\xi$, the system of FIG. 5B can be analyzed to derive the following transfer function:

$$H_\phi(s) = \frac{Y_P}{U_M} = \frac{1}{s}\left(K_M \frac{N}{M}\right)\left(\frac{\hat{K}_U s^2 + 2\zeta\omega_n s + \omega_n^2}{s^2 + 2\zeta\omega_n s + \omega_n^2}\right) \quad (4)$$

Note from the transfer function that if the canonical feed-forward gain $\hat{K}_u=1$, the transfer function of the system will reduce to (($K_M$N/M) Hz/Volt)*1/s, which is the Laplace-transformed representation of a voltage controlled oscillator having a sensitivity of ($K_M$N/M) Hz/Volt. The inventor has determined that it would be advantageous to have the transfer function of the system of FIG. 5B reduce to that of a near-ideal oscillator. Consequently, the inventor has hypothesized that an advantageous form of adaptation would be that which substantially maintained $\hat{K}_u$ at or near a value of unity or one (1), in that such a value would tend to make the behavior of the system of FIGS. 5A–B approach that of a near-ideal oscillator.

II. Adapted Systems

As noted, if the canonical feed-forward gain $\hat{K}_u$ is maintained at approximately one (1), the behavior of the system of FIGS. 5A–B approaches that of a near-ideal voltage controlled oscillator having a sensitivity of $K_M$N/M Hz/Volt. The inventor has devised two main adaptation schemes which tend to make the system of FIGS. 5A–B behave as a near-ideal system: a raw-error based adaptation scheme, and a filtered-error adaptation scheme.

A. Raw-Error Adapted System

As noted, the inventor has determined that it is desirable that the canonical feed-forward gain $\hat{K}_U$ be such that the transfer function of the system shown in FIG. 5B preferably reduce to that of a near-ideal oscillator. The inventor has devised a rule which can be utilized to maintain the canonical feed-forward gain $\hat{K}$ so that the transfer function approaches that of an ideal oscillator. This rule is as follows:

$$\frac{d\hat{K}_U}{dt} = \gamma_1 \hat{U}_M y_1. \quad (5)$$

The adaptation equations are derived under the condition that the rate of change of energy of the error (either raw or filtered) is always negative. That is, over time, the error tends to zero.

Figure 6A:
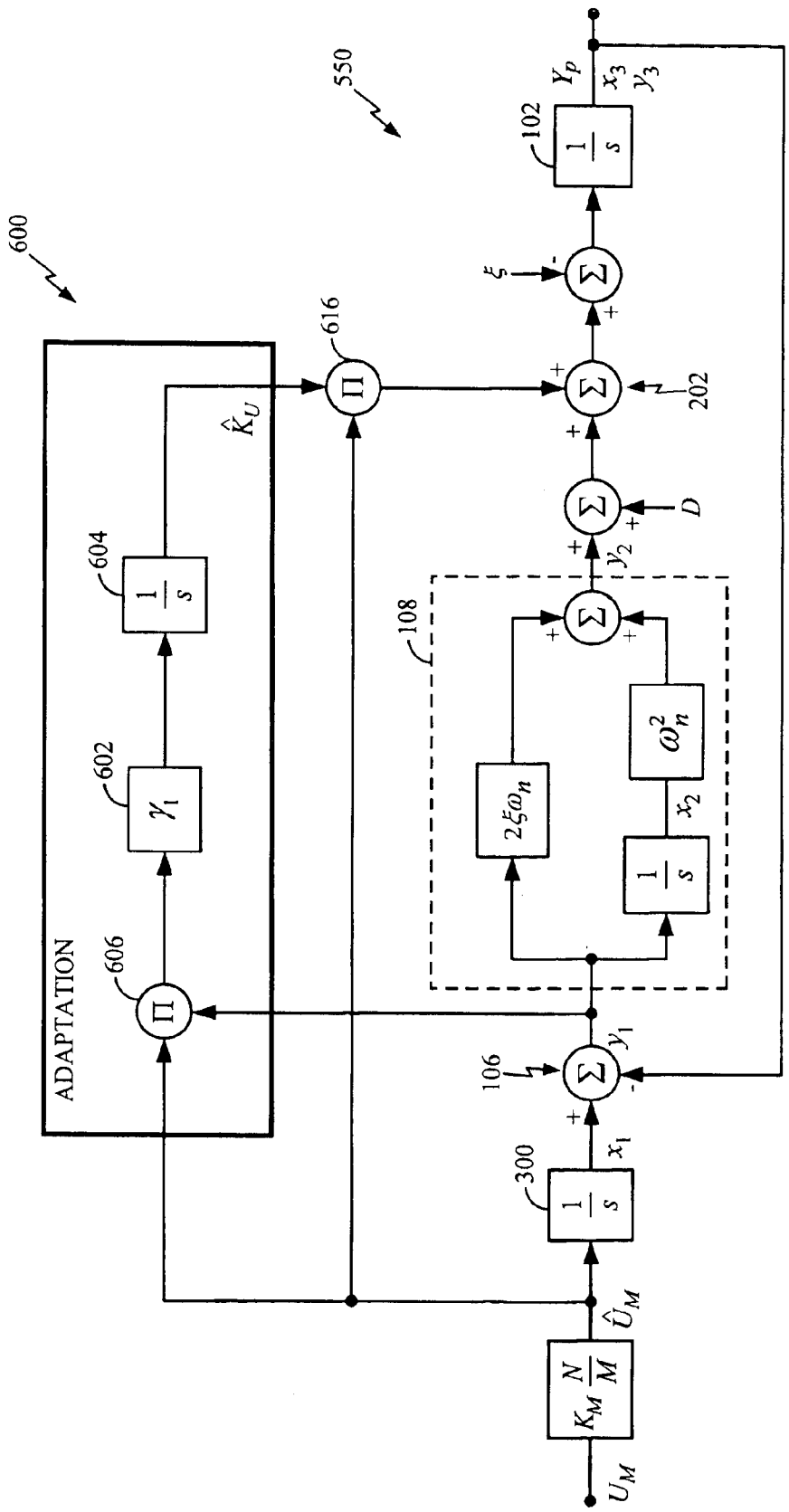
FIG. 6A shows the system of FIG. 5B having an additional forward-gain-adaptation module.

FIG. 6A shows the system of FIG. 5B having an additional forward-gain-adaptation module 600 which implements the foregoing rule. In words, the raw-error rule states, that in one implementation, the canonical feed-forward gain, $\hat{K}_U$, which will tend to make the system behave as a near-ideal oscillator, can be found by integrating $\gamma_1$ times the product of the canonical input, $\hat{U}_M$, and the raw-error signal, $y_1$. In the raw-error rule, $\gamma_1$ is a positive constant that helps determine the rapidity of the adaptation. The raw-error rule is based on stability arguments, and is intended to make it likely that the entire Phase Locked Loop/Adaptation system is stable for all values of $\gamma_1$. With respect to FIG. 6A, the components which substantially implement the raw-error adaptation rule are leading multiplier 606, forward-gain-adaptation module variable gain amplifier 602, having a gain $\gamma_1$, and forward-gain-adaptation module integrator 604.

Continuing to refer to FIG. 6A, the canonical input $\hat{U}_M$ is coupled to an input of the leading multiplier 606. A raw-error $y_1$ terminal (carrying raw-error signal $y_1$) is coupled to an input of the leading multiplier 606. The output of leading multiplier 606 is coupled to an input of a forward-gain-adaptation module variable gain amplifier 602 having a gain of $\gamma_1$. The output of the forward-gain-adaptation module variable gain amplifier 602 is coupled to the input of the forward-gain-adaptation module integrator 604. Connected to an input of a trailing multiplier 616 are both the output of the forward-gain-adaptation module integrator 604 and a canonical version of the input signal, $\hat{U}_M$. The output of the trailing multiplier 616 is operably coupled with an input of the summing junction 202. With respect to the remaining system components, the system functions as has been shown and described herein.

Although not explicitly shown in the figures, in other implementations, there is a filter, substantially similar to loop filter 108, interposed between leading multiplier 606 and forward-gain-adaptation module variable gain amplifier 602. Consequently, wherever leading multiplier 606 and forward-gain-adaptation module variable gain amplifier 602 appear in the figures or are discussed herein, it is to be understood that in alternate implementations there is a filter, substantially similar to loop filter 108, interposed between leading multiplier 606 and forward-gain-adaptation module variable gain amplifier 602.

Although proportional-contribution variable gain amplifiers are described herein (e.g., proportional-contribution variable gain amplifier 610, described below, and proportional-contribution variable gain amplifier 710, described below), those having ordinary skill in the art will recognize that such proportional-contribution variable gain amplifiers appearing and described herein are to be representative of controllers such as proportional-integral (PI) controllers and proportional-integral-derivative (PID) controllers.

Although voltage controlled oscillators are actually non-linear, there exists recognized ranges of operations of voltage controlled oscillators, which, for engineering purposes, can be treated as substantially linear. Consequently, the discussion herein treats voltage controlled oscillators as substantially linear, as is often done in engineering applications. Although the use of "divide by N" circuits are described herein, in other implementations the voltage controlled oscillators are down converted with mixers, rather than with "divide by N" circuits.

The inventor has found that, in practice, the slave VCO 102 may have a response that is not completely modeled by an ideal oscillator (such as is shown in FIG. 6A), or that there may be other un-modeled dynamics, such as additional components in the loop filter of FIG. 6A, and that these differences between practical systems and the modeled systems limit the maximum magnitude of $\gamma_1$ over which the phase locked loop of FIG. 6A will remain viable. In such real world situations, the inventor has found it advantageous to augment the raw-error rule with a proportional contribution ($\gamma_2$), and a 'leakage' factor ($\delta_1$). The inventor points out that, heuristically, the proportional control can be conceived of as being used to accelerate the adaptation, while the leakage factor can be conceived of as being one of several methods available to make the adaptive system robust with respect to disturbances and un-modeled dynamics. An alternative system implementing the proportional contribution and the leakage factor augmentation of the basic foregoing-described raw-error rule is shown following in FIG. 6B.

Figure 6B:
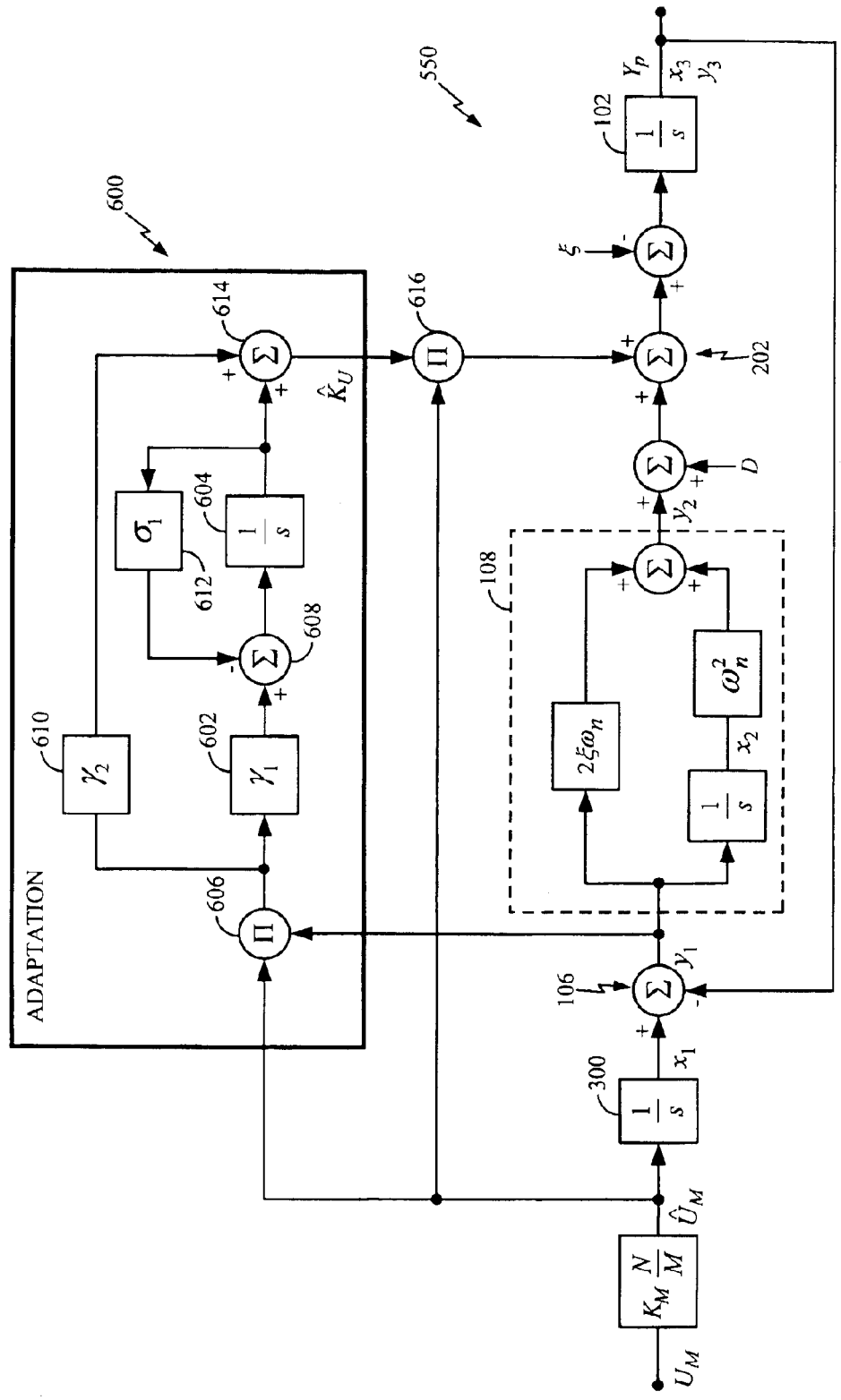
FIG. 6B illustrates the system depicted in FIG. 6A, shown with additional augmentation components in the forward-gain-adaptation module.

FIG. 6B illustrates the system depicted in FIG. 6A, shown with additional augmentation components in the forward-gain-adaptation module 600. As can be seen from FIG. 6B, in this implementation forward-gain-adaptation module 600 is driven, at least in part, with what can be characterized as the "raw-error" signal $y_1$. The signal $y_1$ is referred to herein as the "raw-error" signal to distinguish it from what is referred to herein as the "filtered-error" signal $y_2$.

Continuing to refer to FIG. 6B, the canonical input $\hat{U}_M$ is coupled to an input of the leading multiplier 606. The raw-error $y_1$ is coupled to an input of the leading multiplier 606. The output of leading multiplier 606 is coupled to an input of a forward-gain-adaptation module variable gain amplifier 602 having a gain of $\gamma_1$. The output of the forward-gain-adaptation module variable gain amplifier 602 is coupled to the input of a summing junction 608. The output of the summing junction 608 is coupled to the input of a forward-gain-adaptation module integrator 604. The output of the forward-gain-adaptation module integrator 604 is connected in negative feedback fashion to an input of the summing junction 608, where the negative feedback is provided by leakage-factor variable gain amplifier 612 having a gain of $\sigma_1$.

The output of the forward-gain-adaptation module integrator 604 is coupled to an input of a summing junction 614. Also connected to an input of the summing junction 614 is an output of the proportional-contribution variable gain amplifier 610 having a gain of $\gamma_2$. The input the proportional-contribution variable gain amplifier 610 is coupled to the output of the leading multiplier 606.

An output of the summing junction 614 is coupled to the input of the trailing multiplier 616. Connected to an input of the trailing multiplier 616 is a canonical version of the input signal, $\hat{U}_M$. The output of the trailing multiplier 616 is operably coupled with an input of the summing junction 202. With respect to the remaining system components, the system functions as shown and has been described herein.

B. Filtered-Error Adapted System

Intuitively, it would seem that adaptation using the filtered-error signal $y_2$ would be preferable to using the raw-error signal $y_1$ to adapt the system. However, when the inventor attempted to use the filtered-error signal $y_2$ to perform the adaptation, the inventor unexpectedly discovered that the adaptation became extremely sensitive to a first signal, $\xi$, which is used herein to indicate some uncontrollable and unexpected external influence to the system (e.g., noise). Accordingly, the inventor devised an internal canceling signal, D, which is intended to cancel the residual influence of $\xi$ which is not counteracted by the loop filter 108.

In light of the foregoing, the inventor has devised two rules which can be utilized to create a system whose transfer function approaches that of an ideal oscillator. These two rules are as follows:

$$\frac{d\hat{K}u}{dt} = \gamma_1 \hat{U}_M y_2, \tag{6}$$

-continued $$\frac{dD}{dt} = \gamma_3 \gamma_2. \quad (7)$$

The adaptation equations are derived under the condition that the rate of change of energy of the error (either raw or filtered) is always negative. That is, over time, the error tends to zero.

Figure 7A:
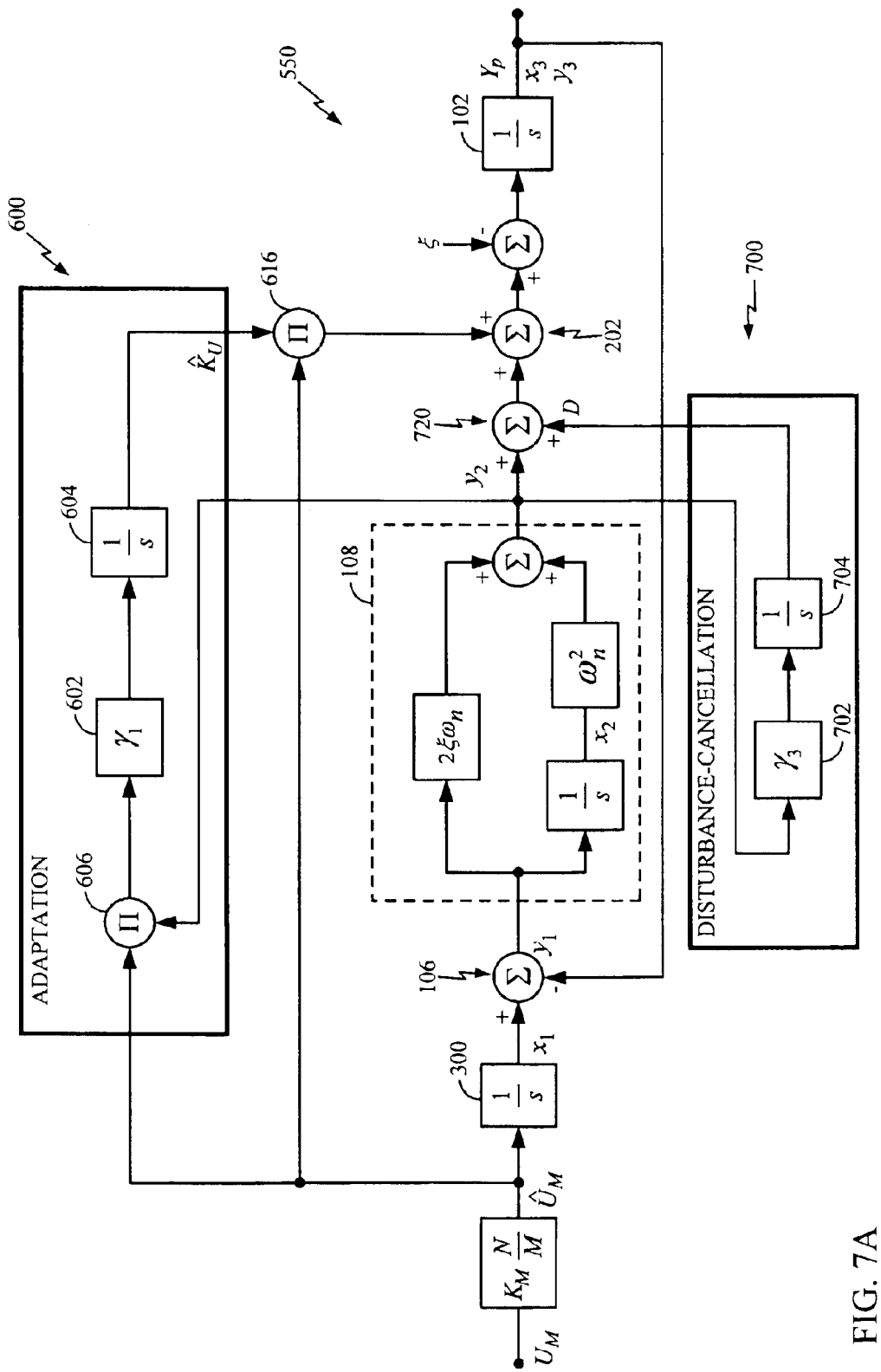
FIG. 7A illustrates a system somewhat similar to the system depicted in FIG. 6A, but with different connections and the addition of a disturbance-cancellation module.

FIG. 7A shows modules 600 and 700 which implement the foregoing rules. In words, the filtered-error rule states that, in one implementation, the system of FIG. 7A can be made to approach the behavior of an ideal oscillator provided that the canonical feed-forward gain, $\hat{K}_U$, is found by integrating $\gamma_1$ times the product of the canonical input, $\hat{U}_M$, and the filtered-error, $y_2$, and further provided that a disturbance-cancellation factor, D, which is found by integrating $\gamma_3$ times the filtered-error, $y_2$, be injected into the system. In the filtered-error rule, $\gamma_1$ and $\gamma_3$ are positive constants that help determine the rapidity of the adaptation. The components which substantially implement the filtered-error adaptation rule are the forward-gain-adaptation module 600 components of the leading multiplier 606, forward-gain-adaptation module variable gain amplifier 602, having a gain of $\gamma_1$, and forward-gain-adaptation module integrator 604, and the disturbance-cancellation module 700 components of a disturbance-cancellation-module variable gain amplifier 702, having a gain of $\gamma_3$, and an disturbance-cancellation-module integrator 704.

The system shown in FIG. 7A is similar to the system depicted in FIG. 6A, but with different connections and the addition of a disturbance-cancellation module 700. As can be seen from FIG. 6A, the forward-gain-adaptation module 600 is driven, at least in part, with what those skilled in the art will appreciate can be the filtered-error signal $y_2$. That is, whereas in FIG. 6A one input to the leading multiplier 606 was the raw-error signal $y_1$, in FIG. 7A that same input is now shown as the filtered-error signal $y_2$. Otherwise, the connections are as shown and described in relation to FIG. 6A, and consequently the discussion of those components common with FIG. 6A will not be repeated here.

Continuing to refer to FIG. 7A, with respect to disturbance-cancellation module 700, the filtered-error signal $y_2$ is coupled to an input of the disturbance-cancellation-module variable gain amplifier 702 having a gain of $\gamma_3$. The output of the disturbance-cancellation-module variable gain amplifier 702 having a gain of $\gamma_3$ is coupled to the input of the disturbance-cancellation-module integrator 704. The output of the disturbance-cancellation-module integrator 704 is coupled to an input of a summing junction 720.

An input of a summing junction 720 is coupled with the filtered-error signal $y_2$. An output of the summing junction 720 is coupled with an input of the summing junction 202. With respect to the remaining system components, the system functions as shown and has been described herein.

Just as with the raw-error rule, the inventor has found that, in practice, the plant (slave VCO) 102 may have a response that is not completely modeled by a pure integrator (such as is shown in FIG. 7A), or that there may be other un-modeled dynamics, such as additional components in the loop filter 108, and that these differences between practical systems and the modeled systems limit the maximum magnitude of $\gamma_3$ over which the system shown in FIG. 7A is viable. In such real world situations, the inventor has found it advantageous to augment the filtered-error rule with the proportional contribution factors $\gamma_2$, $\gamma_4$, and the leakage factors $\delta 1$, $\delta 2$. An alternative system implementing the proportional contribution and the leakage augmentations of the basic foregoing-described filtered-error rule is shown following in FIG. 7B.

Figure 7B:
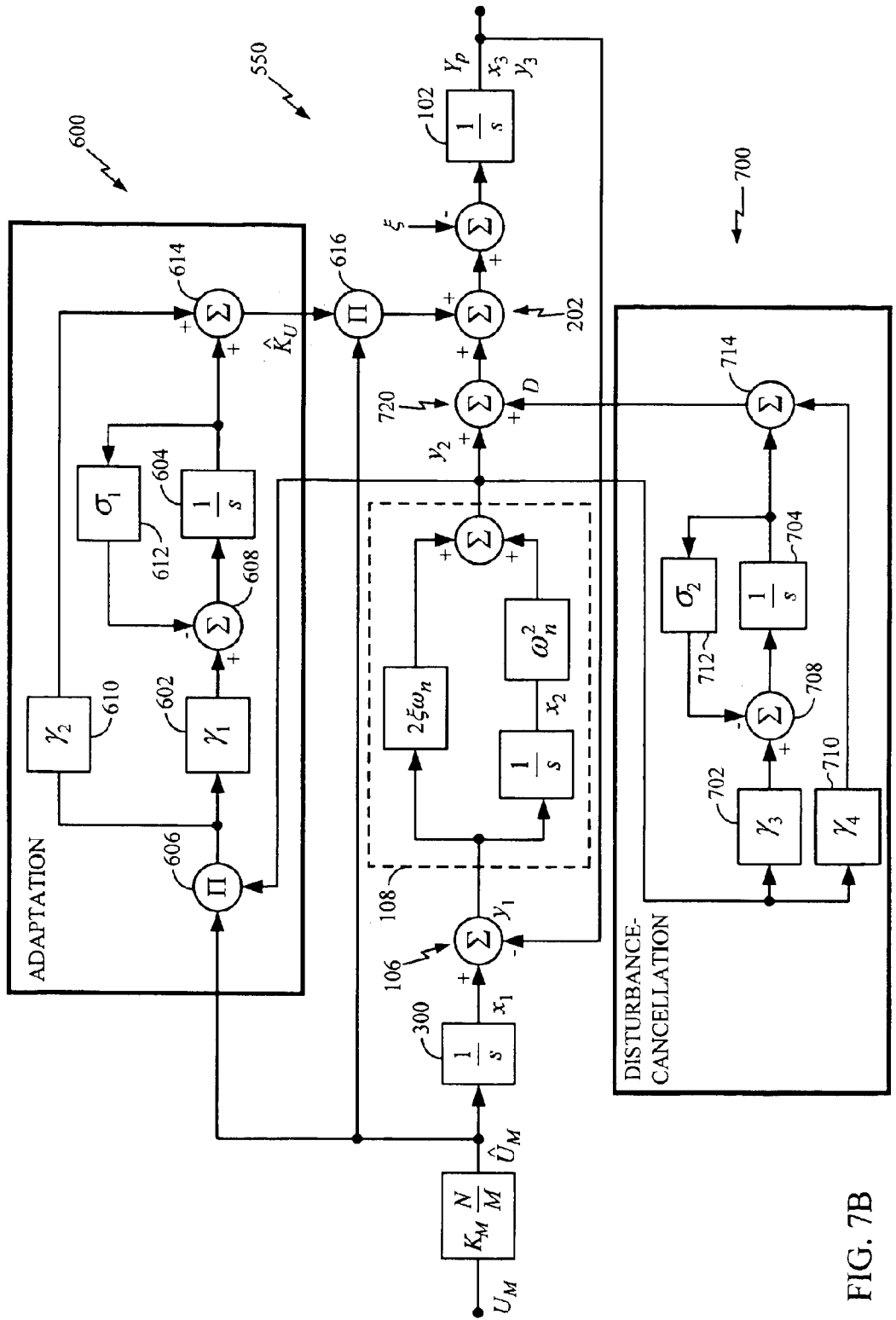
FIG. 7B illustrates a system somewhat similar to the system depicted in FIG. 7A, but with additional components.

FIG. 7B illustrates a system somewhat similar to the system depicted in FIG. 7A, but with additional components in modules 600 and 700. As can be seen from FIG. 7B, in this implementation forward-gain-adaptation module 600 is similar to forward-gain-adaptation module 600 of FIG. 6B, but is driven, at least in part, with what those skilled in the art will appreciate can be characterized as the filtered-error signal $y_2$. That is, whereas in FIG. 6B one input to the leading multiplier 606 was the raw-error signal $y_1$, in FIG. 7B that same input is now shown as the filtered-error signal $y_2$. Otherwise, the connections are as shown and described in relation to FIG. 6B, and consequently the discussion of those components common with FIG. 6B will not be repeated here.

Continuing to refer to FIG. 7B, with respect to disturbance-cancellation module 700, the filtered-error signal $y_2$ is coupled to an input of the disturbance-cancellation-module variable gain amplifier 702 having a gain of $\gamma_3$. The output of the disturbance-cancellation-module variable gain amplifier 702 having a gain of $\gamma_3$ is coupled to an input of a summing junction 708. The output of the summing junction 708 is coupled to an input of a disturbance-cancellation-module integrator 704. The output of the disturbance-cancellation-module integrator 704 is coupled in negative feedback fashion to an input of the summing junction 708, where the negative feedback is provided by disturbance-cancellation-module leakage-factor variable gain amplifier 712 having a gain of $\sigma_2$.

The output of the disturbance-cancellation-module integrator 704 is coupled to the input of the summing junction 714. Coupled to the input of the summing junction 714 is the output of the disturbance-cancellation-module proportional-contribution variable gain amplifier 710 having a gain of $\gamma_4$. An input of the disturbance-cancellation-module proportional-contribution variable gain amplifier 710 is coupled to the "filtered-error" $y_2$.

The output of the summing junction 714 is coupled to an input of the summing junction 720. An input of a summing junction 720 is coupled with the filtered-error signal $y_2$. An output of the summing junction 720 is coupled with an input of the summing junction 202. With respect to the remaining system components, the system functions has been as shown and described herein.

Those having ordinary skill in the art will recognize that the state of the art has progressed to the point where there is little distinction left between hardware and software implementations of aspects of systems; the use of hardware or software is generally (but not always, in that in certain contexts the choice between hardware and software can become significant) a design choice representing cost vs. efficiency tradeoffs. Those having ordinary skill in the art will appreciate that there are various vehicles by which aspects of processes and/or systems described herein can be effected (e.g., hardware, software, and/or firmware), and that the preferred vehicle will vary with the context in which the processes and/or systems are deployed. For example, if an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which aspects of the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The foregoing detailed description has set forth various embodiments of the devices and/or processes via the use of block diagrams, flowcharts, and examples. Insofar as such block diagrams, flowcharts, and examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. In one embodiment, the present invention may be implemented via Application Specific Integrated Circuits (ASICs). However, those skilled in the art will recognize that the embodiments disclosed herein, in whole or in part, can be equivalently implemented in standard Integrated Circuits, as one or more computer programs running on one or more computers (e.g., as one or more programs running on one or more computer systems), as one or more programs running on one or more controllers (e.g., microcontrollers) as one or more programs running on one or more processors (e.g., microprocessors, or digital signal processors), as firmware, or as virtually any combination thereof, and that designing the circuitry and/or writing the code for the software and or firmware would be well within the skill of one of ordinary skill in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of signal bearing media include, but are not limited to, the following: recordable type media such as floppy disks, hard disk drives, CD ROMs, digital tape, and computer memory; and transmission type media such as digital and analog communication links using TDM or IP based communication links (e.g., packet links).

In a general sense, those skilled in the art will recognize that the various embodiments described herein which can be implemented, individually and/or collectively, by a wide range of hardware, software, firmware, or any combination thereof can be viewed as being composed of various types of "electrical circuitry." Consequently, as used herein "electrical circuitry" includes, but is not limited to, electrical circuitry having at least one discrete electrical circuit, electrical circuitry having at least one integrated circuit, electrical circuitry having at least one application specific integrated circuit, electrical circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), electrical circuitry forming a memory device (e.g., forms of random access memory), and electrical circuitry forming a communications device (e.g., a modem, communications switch, or optical-electrical equipment).

Figure 8A:
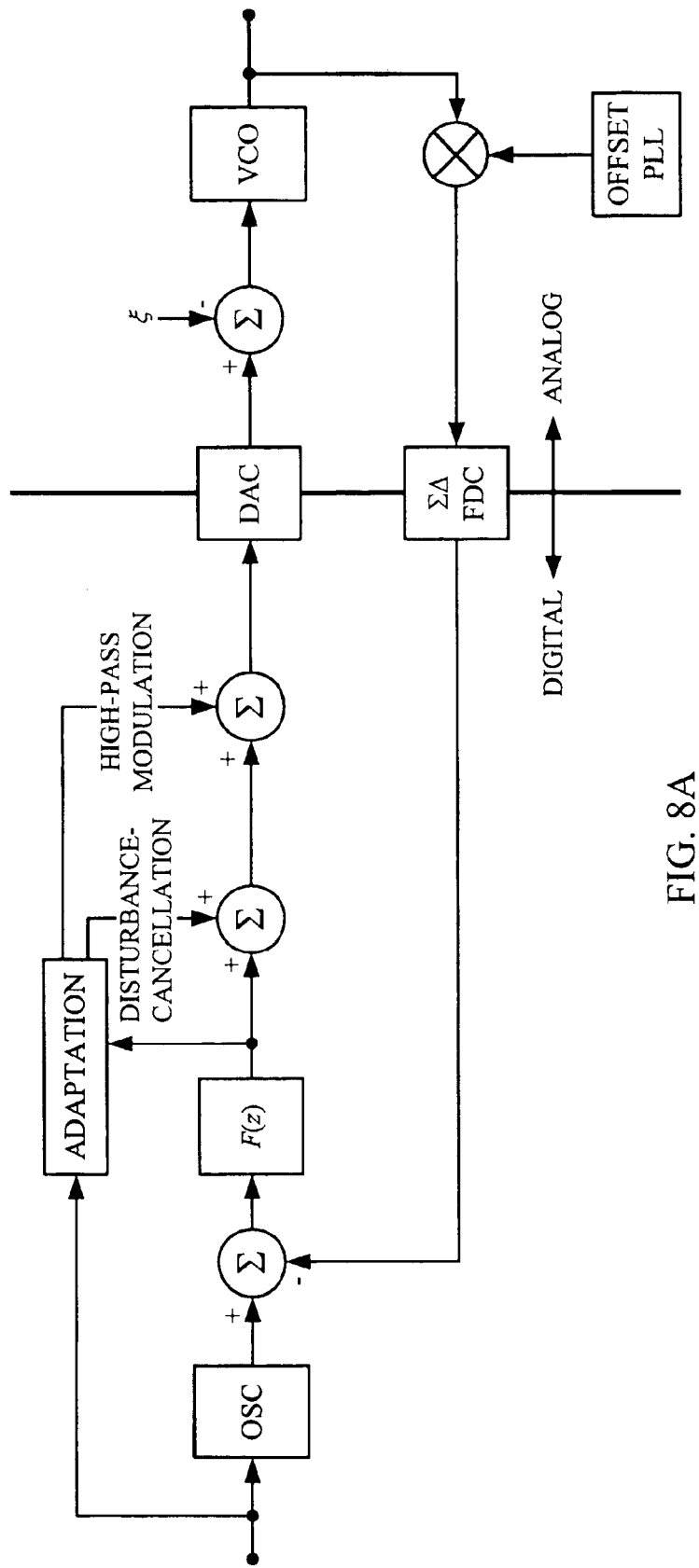
FIG. 8A shows a system which favors mainly digital implementation.
Figure 8B:
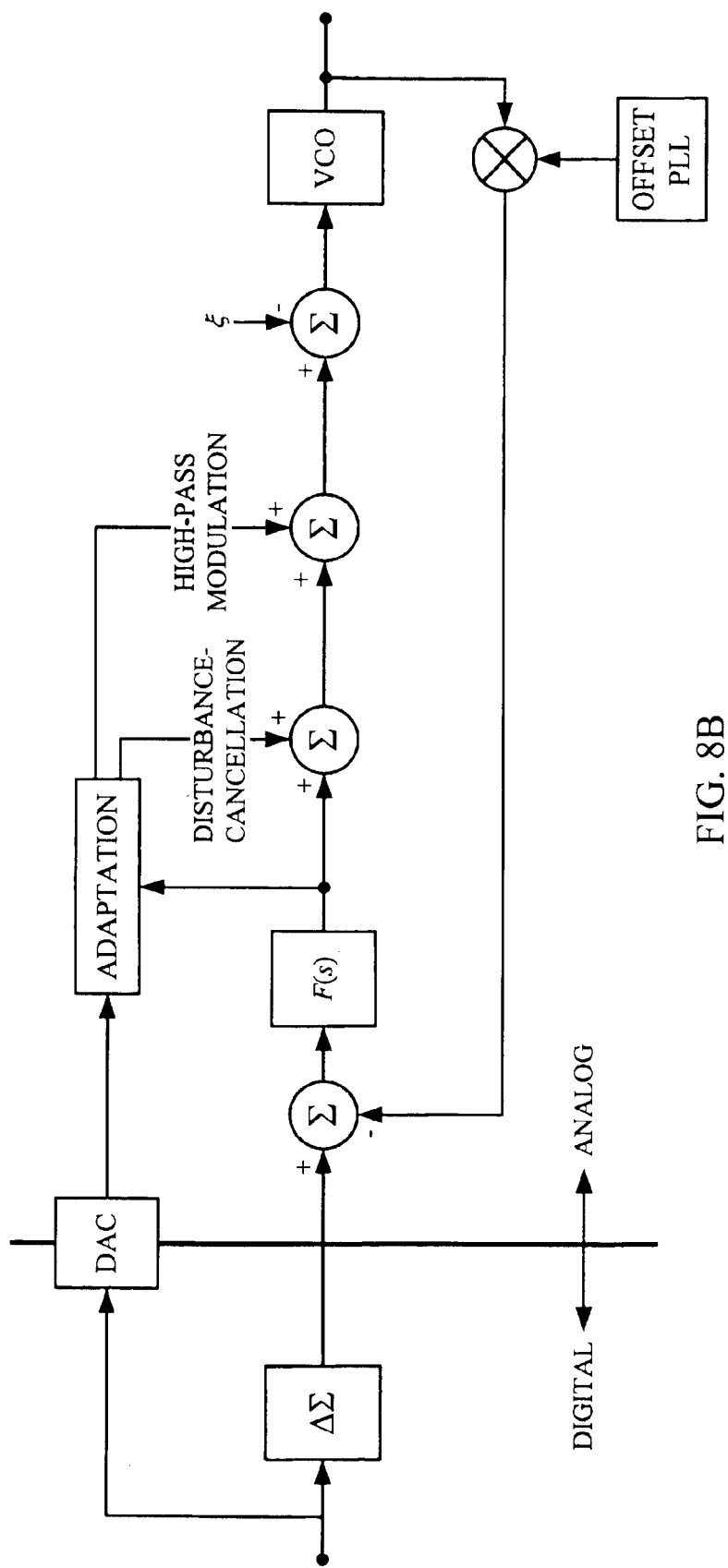
FIG. 8B depicts a system which favors mainly analog implementation.

Those skilled in the art will recognize that it is common within the art to describe devices and/or processes in the fashion set forth herein, and thereafter use standard engineering practices to integrate such described devices and/or processes into systems which are typically partly analog and partly digital. That is, the devices and/or processes described herein can be integrated into analog and partly digital systems via a reasonable amount of experimentation well within the ambit of those having an ordinary amount of skill in the art. FIGS. 8A and 8B show examples of systems into which at least a part of the herein described devices and/or processes may be integrated with a reasonable amount of experimentation.

FIG. 8A shows a system particularly suited to digital implementation. The partition between the digital and analog portions is marked on FIG. 8A. The system may optionally include a mixer to down-convert the output. The master oscillator, loop filter and adaptation circuitry are digital. The output of the VCO enters a $\Sigma\Delta$ down-converter to form an error with a digital oscillator. The output of the loop filter and adaptation circuits is converted to an analog signal and applied to the input of the VCO.

FIG. 8B depicts a system particularly suited to analog implementation. The partition between the digital and analog portions is marked on FIG. 8B. The system of FIG. 8B is an alternative approach to that of FIG. 8A, in that the partition of FIG. 8B favors analog circuitry. This approach is suitable for adaptation algorithms such as have been described herein.

$\Sigma\Delta$ Fractional N Phase Locked Loop Embodiment

Rather than directly modulating an oscillator as discussed above, a phase locked loop may be modulated by dynamically changing the loop divider ratio, N. In particular, N can be controlled with a $\Sigma\Delta$-modulator to allow a fractional rather than integer value. Just as with the phase locked loop considered previously, two-point modulation can be applied to such $\Sigma\Delta$ fractional-N loops, as will now be shown.

Figure 9A:
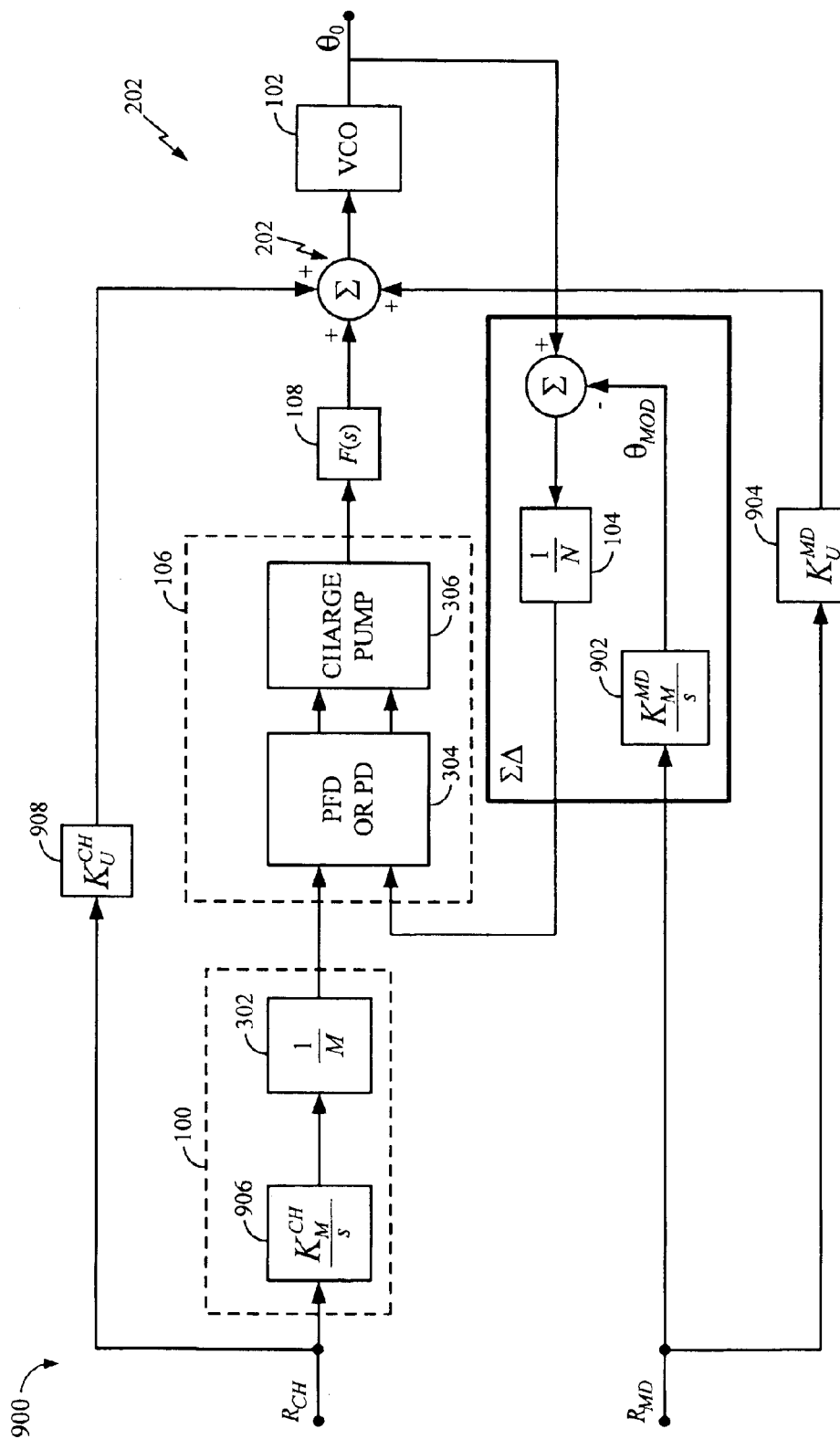
FIG. 9A shows a system having a phase locked loop, somewhat analogous to the phase locked loop shown and discussed in relation to FIG. 3, but augmented with a linear model of a $\Sigma\Delta$ modulator.

FIG. 9A shows a system having a phase locked loop 900, somewhat analogous to the phase locked loop 350 (FIG. 3), but augmented with a linear model of a $\Sigma\Delta$ modulator. (Although the $\Sigma\Delta$ modulator typically acts to alter the division ratio of the loop, FIG. 9A shows a linearized version of a $\Sigma\Delta$ modulator, in which (constant) N represents the nominal division ratio. The small changes in division ratio are represented by the injected phase modulation, $\theta_{MOD}$.)

Although a linearized version of a $\Sigma\Delta$ modulator is shown and described herein for sake of clarity and ease of illustration, an actual $\Sigma\Delta$ modulator (as opposed to the linear model used in analysis) typically generates a high resolution signal using only a few levels. Specifically, a $\Sigma\Delta$ modulator generally achieves the foregoing by dithering the output between levels such that, when filtered, the output has the desired value. In the context considered herein, the $\Sigma\Delta$ modulator is typically implemented in digital circuitry. Then, the division ratio N is dithered between several discrete values, such that the required value is generated when filtered by the low-pass filtering action of the phase locked loop. Accordingly, when linearized $\Sigma\Delta$ modulators, in part or in whole, are shown, described, and/or referenced herein, such partial or whole linearized $\Sigma\Delta$ modulators are meant to be representative of partial or whole linearized analytic versions of $\Sigma\Delta$ modulators, as well as substantially all the partial or whole physical component implementations of $\Sigma\Delta$ modulators.

The phase locked loop 900 has two inputs: an upper input $R_{CH}$, and a lower input $R_{MD}$. The upper input $R_{CH}$ is constant and sets the frequency of the channel. (That is, the frequency about which the modulated spectrum is centered.) The lower input $R_{MD}$ varies with time and causes a frequency modulation of VCO 902. This frequency modulation is converted to phase modulation $\theta_{MOD}$ and injected into the phase locked loop 900.

Scaled versions of upper input $R_{CH}$ and lower input $R_{MD}$, where such scaling is respectively controlled by the gain $$K_U^{CH}$$

of the variable gain amplifier 908 and the gain $$K_U^{MD}$$

of the variable gain amplifier 904, are injected at the summing junction 202 input of the VCO 102 to allow two-point modulation. Comparison of the phase locked loop 900 of FIG. 9A with the phase locked loop 350 shows that such phase locked loops appear to be substantially different. Hence it is not readily apparent how the processes and devices previously described herein could be applied to the phase locked loop 900.

In order to overcome the foregoing difficulty, the inventor has discovered that the ΣΔ fractional-N phase locked loop 900 can be transformed such that the processes and devices described previously can be applied to the phase locked loop 900. This transformation can be understood as follows.

Continuing to refer to FIG. 9A, let $$\frac{K_U^{MD}}{K_U^{CH}} = \frac{K_M^{MD}}{K_M^{CH}} \frac{M}{N} \quad (8)$$

$$K_U = K_U^{CH} \quad (9)$$

$$K_M = K_M^{CH} \quad (10)$$

Figure 9B:
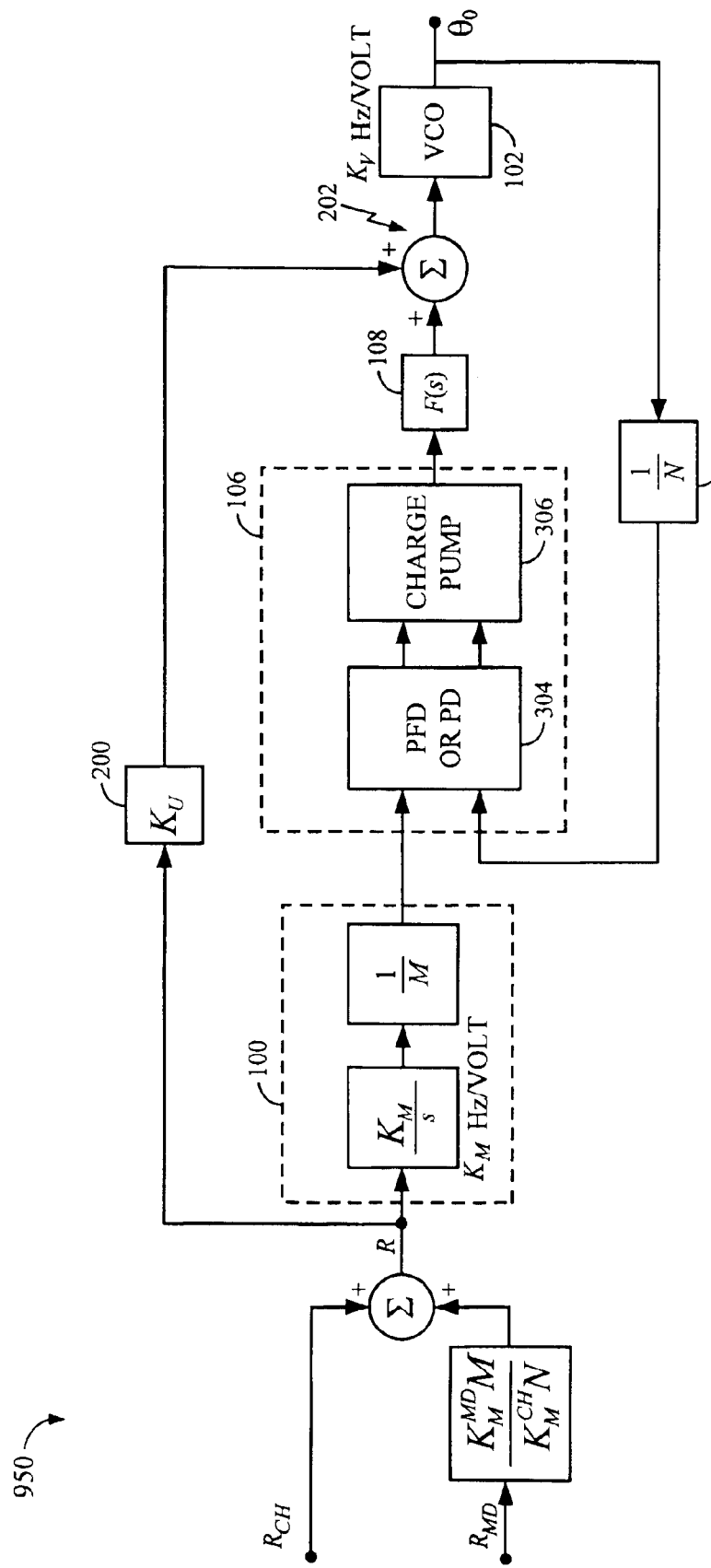
FIG. 9B shows a system having a phase locked loop, which is substantially mathematically equivalent to phase locked loop of FIG. 9A, but which has been manipulated such that the phase locked loop appearing in FIG. 9B has a substantially similar topology to the phase locked loop of FIG. 5A.

In light of the foregoing, using mathematical manipulation (analogous to the mathematical manipulations described in relation to FIGS. 5A and 5B, above) the system of FIG. 9A can be transformed into the substantially mathematically equivalent system shown in FIG. 9B.

FIG. 9B shows a system having a phase locked loop 950, which is substantially mathematically equivalent to the phase locked loop 900, but which has been manipulated such that the phase locked loop 950 appearing in FIG. 9B has a topology substantially similar to the phase locked loop 550 of FIG. 5A (note that oscillator 300 is represented in its Laplace transform version of $K_m/s$), except that the phase locked loop 950 is shown having reference input which can be equated with the following expression:

$$R = R_{CH} + \frac{K_M^{MD}}{K_M^{CH}} \frac{M}{N} R_{MD}. \quad (11)$$

As can be seen by comparison of the phase locked loop 950 with the phase locked loop 550, apart from the difference in inputs of the phase locked loop 950 and the phase locked loop 550, the phase locked loop 950 and the phase locked loop 550 are topologically substantially identical.

With the aid of the fact that the phase locked loop 950 of FIG. 9B, arising from the above-described mathematical transformations, is substantially similar to the phase locked loop 550, the inventor has created ΣΔ fractional-N phase locked loops which incorporate the foregoing described processes and devices. These ΣΔ fractional-N phase locked loops will now be described.

Figure 10A:
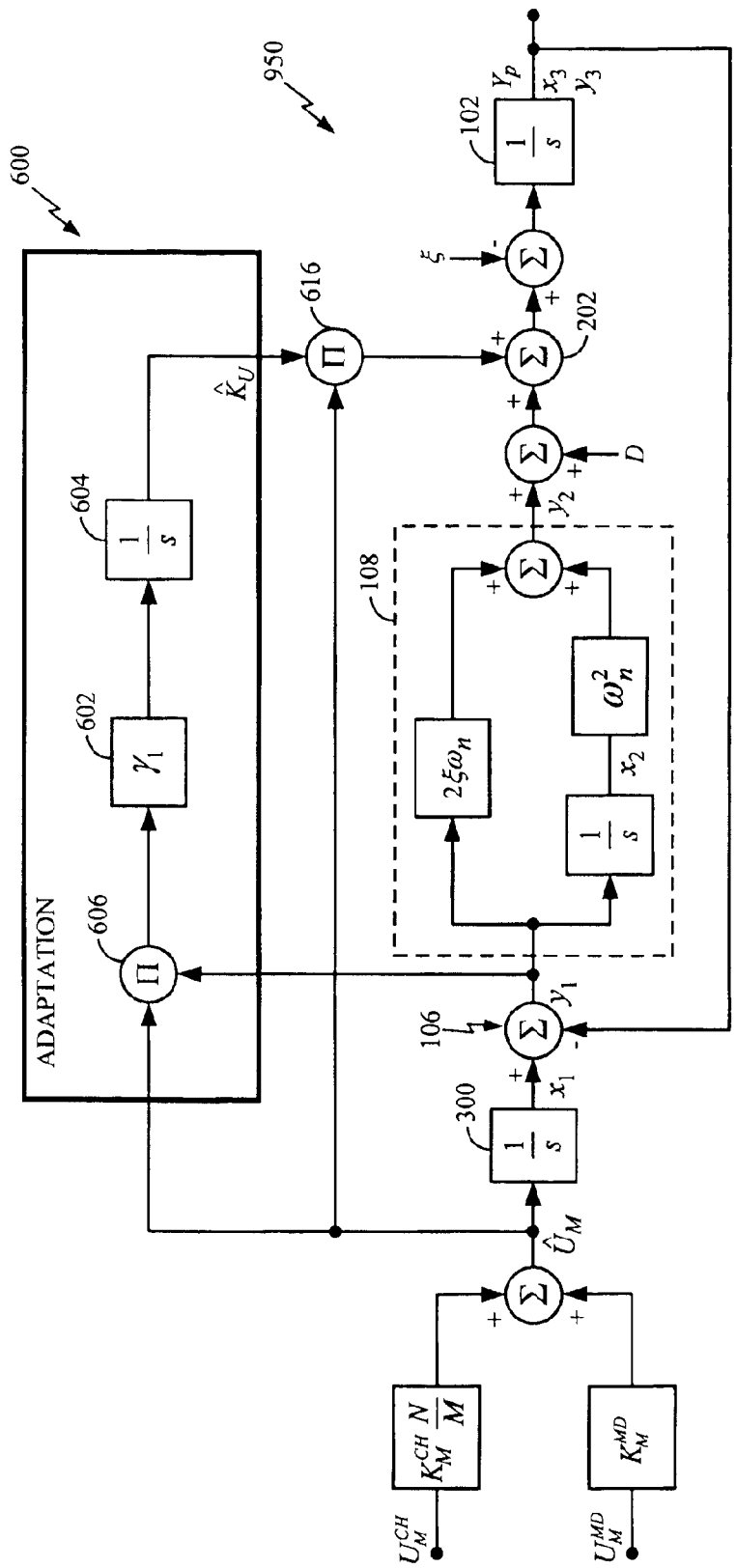
FIG. 10A shows a system having the $\Sigma\Delta$ Fractional-N phase locked loop of FIG. 9B, but with an additional forward-gain-adaptation module which implements the above-described raw-error adapted system rule as described in relation to FIG. 6B.

FIG. 10A shows a system having the ΣΔ fractional-N phase locked loop 950 of FIG. 9B, but with an additional forward-gain-adaptation module 600 which implements the above-described raw-error adapted system rule as described in relation to FIG. 6B. As noted above, this rule is as follows:

$$\frac{d\hat{K}_U}{dt} = \gamma_1 \hat{U}_M y_1 \quad (12)$$

As noted, FIG. 10A is substantially similar to FIG. 6A, except that, with respect to FIG. 10A

$$\hat{U}_M = U_M^{CH} * K_M^{CH} \frac{N}{M} + U_M^{MD} * K_M^{MD} \quad (13)$$

where $R_{CH}$ has been recast as $$U_M^{CH}$$

and $R_{MD}$ been recast as $$U_M^{MD}$$

for sake of notational simplicity.

Aside from the foregoing difference, the phase locked loop 950 of FIG. 10A functions substantially similarly to the phase locked loop 550 of FIG. 6A, and a description of such functioning will not explicitly be set forth here for sake of brevity.

Figure 10B:
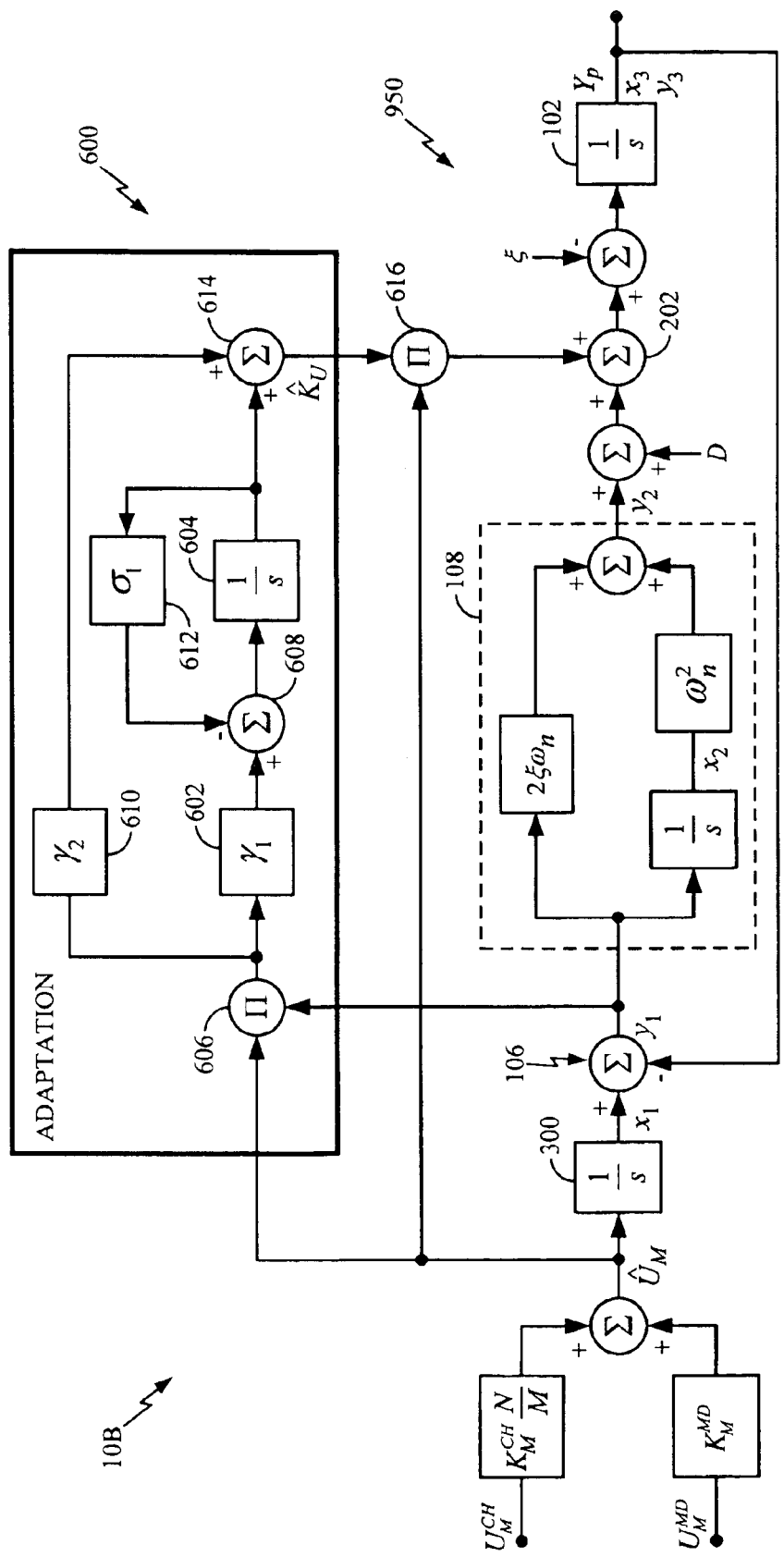
FIG. 10B depicts the system of FIG. 10A having additional augmentation components in the forward-gain-adaptation module.

FIG. 10B depicts the system of FIG. 10A having additional augmentation components in the forward-gain-adaptation module 600. As can be seen by comparison, FIG. 10B is substantially similar to FIG. 6B, except that, with respect to FIG. 10B

$$\hat{U}_M = U_M^{CH} * K_M^{CH} \frac{N}{M} + U_M^{MD} * K_M^{MD} \quad (14)$$

where $R_{CH}$ has been recast as $$U_M^{CH}$$

and $R_{MD}$ been recast as $$U_M^{MD}$$

for sake of notational simplicity.

Aside from the foregoing difference, the phase locked loop 950 of FIG. 10B functions substantially similarly to the phase locked loop 550 of FIG. 6B, and hence a description of such functioning will not explicitly be set forth here for sake of brevity.

Figure 11A:
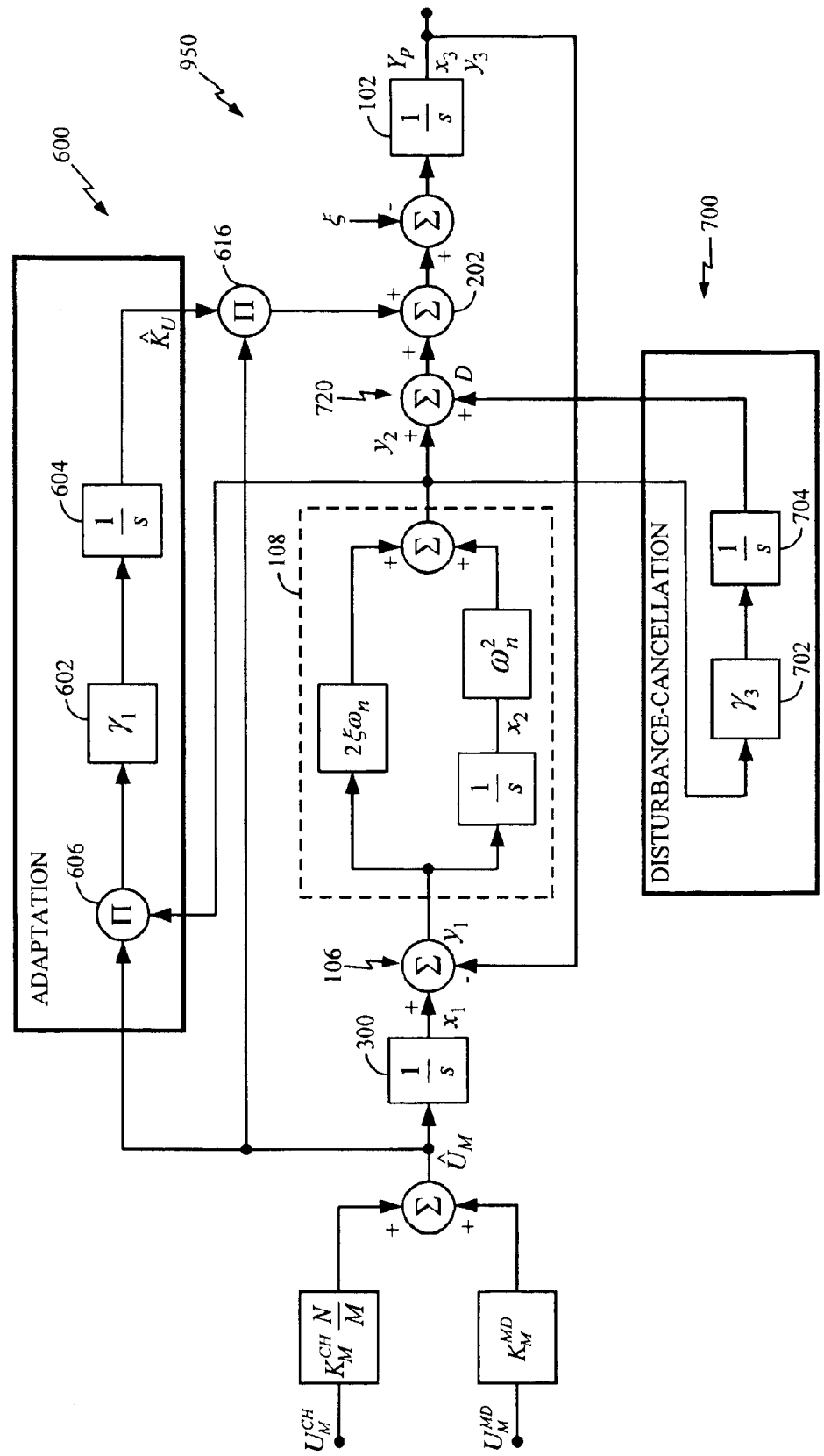
FIG. 11A shows a system having the $\Sigma\Delta$ Fractional-N phase locked loop of FIG. 9B, but with additional modules which help implement the above-described filtered-error adapted system rules as described in relation to FIG. 7A.

FIG. 11A shows a system having the ΣΔ Fractional-N phase locked loop 950 of FIG. 9B, but with additional modules 600 and 700 which help implement the above-described filtered-error adapted system rules as described in relation to FIG. 7A. These two rules are as follows:

$$\frac{d\hat{K}u}{dt} = \gamma_1 \hat{U}_M y_2, \quad (15)$$

$$\frac{dD}{dt} = \gamma_3 y_2. \quad (16)$$

FIG. 11A is substantially similar to FIG. 7A, except that, with respect to FIG. 11A

$$\hat{U}_M = U_M^{CH} * K_M^{CH} \frac{N}{M} + U_M^{MD} * K_M^{MD} \quad (17)$$

where $R_{CH}$ has been recast as $$U_M^{CH}$$

and $R_{MD}$ been recast as $$U_M^{MD}$$

for sake of notational simplicity.

Aside from the foregoing difference, the phase locked loop 950 of FIG. 11A functions substantially similarly to the phase locked loop 550 of FIG. 7A, and hence a description of such functioning will not explicitly be set forth here for sake of brevity.

FIG. 11B illustrates a system somewhat similar to the system depicted in FIG. 11A, but with additional components in modules 600 and 700. As can be seen by comparison, FIG. 11B is substantially similar to FIG. 7B, except that, with respect to FIG. 11B

$$\hat{U}_M = U_M^{CH} * K_M^{CH} \frac{N}{M} + U_M^{MD} * K_M^{MD} \quad (18)$$

where $R_{CH}$ has been recast as $$U_M^{CH}$$

and $R_{MD}$ been recast as $$U_M^{MD}$$

for sake of notational simplicity.

Aside from the foregoing difference, the phase locked loop 950 of FIG. 11B functions substantially similarly to the phase locked loop 550 of FIG. 7B, and hence a description of such functioning will not explicitly be set forth here for sake of brevity.

As described previously in relation to FIGS. 8A and 8B, various actual implementations of the loops and/or systems shown herein may be partitioned between digital and analog domains in many different ways.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

While particular embodiments of the present invention have been shown and described, it will be apparent to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

What is claimed is:

1. A communications system comprising:

a master oscillator having an output operably coupled to a first input of a phase detector;

a slave oscillator having an output operably coupled to a second input of the phase detector; and a forward-gain-adaptation module having a first input operably coupled to a raw-error terminal of the phase detector, wherein said forward-gain-adaptation module having a first input operably coupled to a raw-error terminal of the phase detector comprises:

a forward-gain-adaptation module variable gain amplifier operably coupled with the raw-error terminal of the phase detector; and a forward-gain-adaptation module integrator operably coupled with said forward-gain-adaptation module variable gain amplifier and said slave oscillator.

2. The communication system of claim 1, wherein said forward-gain-adaptation module variable gain amplifier operably coupled with the raw-error terminal of the phase detector comprises:

a leading multiplier having a first input operably coupled to the raw-error terminal of the phase detector and a second input operably coupled to an input of said master oscillator; and said forward-gain-adaptation module variable gain amplifier having an input operably coupled with an output of said leading multiplier.

3. The communications system of claim 1, wherein said forward-gain-adaptation module integrator operably coupled with said forward-gain-adaptation module variable gain amplifier and said slave oscillator comprises:

said forward-gain-adaptation module integrator having an input operably coupled with an output of said forward-gain-adaptation module valuable gain amplifier; and a trailing multiplier having a first input operably coupled to an output of said forward-gain-adaptation module integrator, a second input operably coupled to the input of said master oscillator, and an output operably coupled to an input of said slave oscillator.

4. The communications system of claim 3, wherein said forward-gain-adaptation module integrator having an input operably coupled with an output of said forward-gain-adaptation module variable gain amplifier comprises:

a leakage-factor variable gain amplifier having an input operably coupled with the output of said forward-gain-adaptation module integrator and an output operably coupled with the input of said forward-gain-adaptation module integrator.

5. The communications system of claim 3, wherein said trailing multiplier having a first input operably coupled to an output of said forward-gain-adaptation module integrator, a second input operably coupled to the input of said master oscillator, and an output operably coupled to an input of said slave oscillator comprises:

a proportional-contribution variable gain amplifier having an input operably coupled with the output of a leading multiplier and an output operably coupled with the second input of said trailing multiplier.

6. The communications system of claim 1, wherein said communications system comprises a hand-held phone or a communications base station.

7. The communications system of claim 1, wherein said slave oscillator having an output operably coupled to a second input of the phase detector further comprises a ΣΔ-modulator operably coupled between the output of the slave oscillator and the second input of the phase detector.

8. The communications system of claim 6, wherein said ΣΔ-modulator comprises at least one of a voltage controlled oscillator and a summing junction.

9. A method for controlling a communications system, said method comprising:

adjusting a feed-forward gain of a phase locked loop in response to a raw-error signal of the phase locked loop; and adjusting a slave oscillator of the phase locked loop in response to the feed-forward gain wherein said adjusting a feed-forward gain of a phase locked loop in response to a raw-error signal of the phase locked loop comprises:

controlling the time rate of change of the feed-forward gain proportional to a time history of the raw-error signal.

10. The method of claim 9, wherein said controlling the time rate of change of the feed-forward gain proportional to a time history of the raw-error signal comprises:

creating a product of an input of a master oscillator of the phase locked loop and the raw-error signal;

integrating the product; and adjusting the feed-forward gain in response to said integrating the product.

11. The method of claim 10, wherein said integrating the product comprises:

multiplying the product by an adaptation-module gain to produce an adaptation-module sealed product.

12. The method of claim 10, wherein said integrating the product comprises:

multiplying the product by an adaptation-module gain to produce an adaptation-module scaled product;

summing the adaptation-module scaled product with a leakage-factor scaled feedback integration result; and integrating a result of said summing the adaptation-module scaled product with the leakage-factor sealed feedback Integration result.

13. The method of claim 10, wherein said adjusting the feed-forward gain in response to said integrating the product comprises:

summing a result of said integrating the product with a proportional-contribution scaled version of the product.

14. The method of claim 9, wherein said adjusting a slave oscillator of the phase locked loop in response to the feed-forward gain comprises:

adjusting an input of the slave oscillator of the phase locked loop in response to a product of the feed-forward gain with an input of the phase locked loop.

15. A communications system comprising:

a master oscillator having an output operably coupled to a first input of a phase detector, a slave oscillator having an output operably coupled to a second input of the phase detector; and a forward-gain-adaptation module having a first input operably coupled to a filtered-error terminal of the phase detector, wherein said forward-gain-adaptation module comprises:

a forward-gain-adaptation module variable gain amplifier operably coupled with the filtered-error terminal of the phase detector; and a forward-gain-adaptation module integrator operably coupled with said forward-gain-adaptation module variable gain amplifier and said slave oscillator.

16. The communications system of claim 15, wherein said forward-gain-adaptation module variable gain amplifier operably coupled with the filtered-error terminal of the phase detector comprises:

a leading multiplier having a first input operably coupled to the filtered-error terminal of the phase detector and a second input operably coupled to an input of said master oscillator; and said forward-gain-adaptation module variable gain amplifier having an input operably coupled with an output of said leading multiplier.

17. The communications system of claim 15, wherein said forward-gain-adaptation module integrator operably coupled with said forward-gain-adaptation module variable gain amplifier and said slave oscillator comprises:

said forward-gain-adaptation module integrator having an input operably coupled with an output of said forward-gain-adaptation module variable gain amplifier; and a trailing multiplier having a first input operably coupled to an output of said forward-gain-adaptation module integrator, a second input operably coupled to the input of said master oscillator, and an output operably coupled to an input of said slave oscillator.

18. The communications system claim 17, wherein said forward-gain-adaptation module integrator having an input operably coupled with an output of said forward-gain-adaptation module variable gain amplifier comprises:

a leakage-factor variable gain amplifier having an input operably coupled with the output of said forward-gainadaptation module integrator and an output operably coupled with the input of said forward-gain-adaptation module integrator.

19. The communications system of claim 17, wherein said trailing multiplier having a first input operably coupled to an output of said forward-gain-adaptation module integrator, a second input operably coupled to the input of said master oscillator, and an output operably coupled to an input of said slave oscillator comprises:
a proportional-contribution variable gain amplifier having an input operably coupled with the output of said leading multiplier and an output operably coupled with the second input of said trailing multiplier.

20. The communications system of claim 15, further comprising
a disturbance-cancellation module having a first input operably coupled to a filtered-error terminal of the phase detector and a first output operably coupled to said slave oscillator.

21. The communications system of claim 20, wherein said disturbance-cancellation module having a first input operably coupled to a filtered-error terminal of the phase detector and a first output operably coupled to said slave oscillator comprises:
a first summing junction, having a first input operably coupled with the first output of the disturbance-cancellation module, and a second input operably coupled with the filtered-error terminal; and
said slave oscillator operably coupled with an output of said first summing junction.

22. The communications system of claim 21, wherein said slave oscillator operably coupled with an output of said first summing junction comprises:
a second summing junction, having a first input operably coupled with the output of said fist summing junction, a second input operably coupled with an output of said forward-gain adaptation-module, and an output operably coupled with said slave oscillator.

23. The communication system of claim 20, wherein said disturbance-cancellation module having a first input operably coupled to a filtered-error terminal of the phase detector and a first output operably coupled to said slave oscillator comprises:
a disturbance-cancellation-module variable gain amplifier operably coupled with the filtered-error terminal of the phase detector, and
a disturbance-cancellation-module integrator operably coupled with said disturbance-cancellation-module variable gain amplifier and said slave oscillator.

24. The communications system of claim 23, wherein said disturbance-cancellation-module integrator operably coupled with said disturbance-cancellation-module variable gain amplifier and said slave oscillator comprises:
said disturbance-cancellation-module integrator having an input operably coupled with an output of said disturbance cancellation-module variable gain amplifier.

25. The communications system of claim 24, wherein said disturbance-cancellation-module integrator having an input operably coupled with an output of said disturbance-cancellation-module variable gain amplifier comprises:
a disturbance-cancellation-module leakage-factor variable gain amplifier having an input operably coupled with the output of said disturbance-cancellation-module integrator and an output operably coupled with the input of said disturbance-cancellation-module integrator.

26. The communications system of claim 23, wherein said disturbance-cancellation-module integrator operably coupled with said disturbance-cancellation-module variable gain amplifier and said slave oscillator comprises:
a disturbance-cancellation-module proportional-contribution variable gain amplifier having an input operably coupled with the filtered-error terminal of the phase detector and an output operably coupled with said slave oscillator.

27. The communications system of claim 15, wherein said communications system comprises a hand-held phone or a communications base station.

28. The communications system of claim 15, wherein said slave oscillator having an output operably coupled to a second input of the phase detector further comprises a $\Sigma\Delta$-modulator operably coupled between the output of the slave oscillator and the second input of the phase detector.

29. The communications system of claim 28, wherein said $\Sigma\Delta$-modulator comprises at least one of a voltage controlled oscillator and a summing junction.

30. A method for controlling a communications system, said method comprising:
adjusting a feed-forward gain of a phase locked loop in response to a filtered-error signal of a phase locked loop;
creating a disturbance-cancelled filtered-error signal; and
adjusting a slave oscillator of the phase locked loop in response to the feed-forward gain and the disturbance-cancelled filtered-error signal.

31. The method of claim 30, wherein said adjusting a feed-forward gain of a phase locked loop in response to a altered-error signal of a phase locked loop comprises:
controlling the time rate of change of the feed-forward gain proportional to a time history of the filtered-error signal.

32. The method of claim 31, wherein said controlling the time rate of change of the feed-forward gain proportional to a time history of the filtered-error signal comprises:
creating a product of an input of a master oscillator of the phase locked loop and the filtered-error signal;
integrating the product; and
adjusting the feed-forward gain in response to said integrating the product.

33. The method of claim 32, wherein said integrating the product comprises:
multiplying the product by a forward-gain-adaptation module gain to produce a forward-gain-adaptation module scaled product.

34. The method of claim 32, wherein said integrating the product comprises:
multiplying product by a forward-gain-adaptation module gain to produce a forward-gain-adaptation module scaled product;
summing the forward-gain-adaptation module scaled product with a leakage-factor scaled feedback integration result; and
integrating a result of said summing the forward-gain-adaptation module scaled product with the leakage-factor scaled feedback integration result.

35. The method of claim 32, wherein said adjusting the feed-forward gain in response to said integrating the product comprises:
summing a result of said integrating the product with a proportional-contribution scaled version of the product.

36. The method of claim 30, wherein said creating a disturbance-cancelled filtered-error signal comprises:

integrating the filtered-error signal; and summing the filtered-error signal with a result of said integrating.

37. The method of claim 36, wherein said integrating the filtered-error signal comprises:

multiplying the filtered-error signal by a disturbance-cancellation-module gain to produce a disturbance-cancellation-module scaled filtered-error signal.

38. The method of claim wherein 36, said integrating the filtered-error signal comprises:

multiplying the filtered-error signal by a disturbance-cancellation-module gain to produce a disturbance-cancellation-module scaled filtered-error signal;

summing the disturbance cancellation-module scaled filtered-error signal with a disturbance-cancellation-module leakage-factor scaled feedback integration result; and integrating a result of said summing the disturbance-cancellation-module scaled filtered-error signal with the disturbance-cancellation-module leakage-factor scaled feedback integration result.

39. The method of claim 30, wherein said creating a disturbance-cancelled filtered-error signal comprises:

integrating the filtered-error signal;

summing a result of said integrating the filtered-error signal with a proportional-contribution scaled version of the filtered-error signal; and summing the filtered-error signal with a result of said summing the result of said integrating the filtered-error signal with the proportional-contribution scaled version of the filtered-error signal.

40. The method of claim 30, wherein said adjusting a slave oscillator of the phase locked loop in response to the feed-forward gain and the disturbance-cancelled filtered-error signal comprises:

adjusting an input of the slave oscillator of the phase locked loop in response to the summation of a product, between the feed-forward gain and an input of the phase locked loop, with the disturbance-cancelled filtered-error signal.

* * * * *